(12) United States Patent
Yamamoto et al.

(10) Patent No.: US 9,673,027 B2
(45) Date of Patent: Jun. 6, 2017

(54) TEST APPARATUS AND PLASMA PROCESSING APPARATUS

(71) Applicant: TOKYO ELECTRON LIMITED, Tokyo (JP)

(72) Inventors: Takashi Yamamoto, Miyagi (JP); Junichi Shimada, Saitama (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 502 days.

(21) Appl. No.: 14/161,538

(22) Filed: Jan. 22, 2014

(65) Prior Publication Data

US 2014/0203821 A1 Jul. 24, 2014

Related U.S. Application Data

(60) Provisional application No. 61/759,474, filed on Feb. 1, 2013.

(30) Foreign Application Priority Data

Jan. 24, 2013 (JP) ................................. 2013-010968

(51) Int. Cl.
*H01J 37/32* (2006.01)
*H01L 21/66* (2006.01)

(52) U.S. Cl.
CPC .. *H01J 37/32917* (2013.01); *H01J 37/32082* (2013.01); *H01J 37/32174* (2013.01); *H01L 22/14* (2013.01); *H01L 22/26* (2013.01)

(58) Field of Classification Search
USPC ....... 324/654, 658, 649, 600, 202, 242, 674; 315/111.21, 111.51; 333/17.3, 32;
(Continued)

(56) References Cited

U.S. PATENT DOCUMENTS 5,474,648 A * 12/1995 Patrick .............. H01J 37/32082
156/345.28
5,654,679 A * 8/1997 Mavretic .................. H03H 7/40
333/17.3
(Continued)

FOREIGN PATENT DOCUMENTS

JP 61-173072 U 10/1986
JP 2-38867 A 2/1990
(Continued)

*Primary Examiner* — Melissa Koval
*Assistant Examiner* — Nasima Monsur
(74) *Attorney, Agent, or Firm* — Rothwell, Figg, Ernst & Manbeck, P.C.

(57) ABSTRACT

A test apparatus for efficiently and accurately testing a high frequency voltage dependency of an impedance of a test object without damaging the test object. The test apparatus includes a high frequency power source unit, a reference waveform generator, a matching device, an oscilloscope, a control panel, and a main control unit. The test apparatus may boost a high frequency pulse output at a relatively low power from the high frequency power source unit to a voltage required for a high frequency withstand voltage test to be applied to a test object in a state where impedance matching is performed between the high frequency power source unit and the test by the matching device, that is, under a tuned state. Whether the waveform of the voltage applied to the test object is a defined waveform may be concisely monitored and observed by the oscilloscope.

19 Claims, 13 Drawing Sheets

(58) Field of Classification Search
USPC .................................... 156/345.28; 438/710
See application file for complete search history.

(56) References Cited

U.S. PATENT DOCUMENTS

| | | | |
|---|---|---|---|
| 8,040,068 B2* | 10/2011 | Coumou | H01J 37/32082 |
| | | | 315/111.21 |
| 2006/0220656 A1* | 10/2006 | Tanaka | H01J 37/32082 |
| | | | 324/600 |
| 2010/0203253 A1* | 8/2010 | Grosse | C23C 16/513 |
| | | | 427/452 |
| 2013/0082620 A1* | 4/2013 | Nakamori | H05B 41/2883 |
| | | | 315/246 |

FOREIGN PATENT DOCUMENTS

| | | |
|---|---|---|
| JP | 2009-85721 A | 4/2009 |
| JP | 2009-99858 A | 5/2009 |
| JP | 2010-262825 A | 11/2010 |

* cited by examiner

FIG.5A TRIGGER SIGNAL
FIG.5B REFERENCE WAVEFORM SIGNAL
FIG.5C HIGH FREQUENCY PULSE
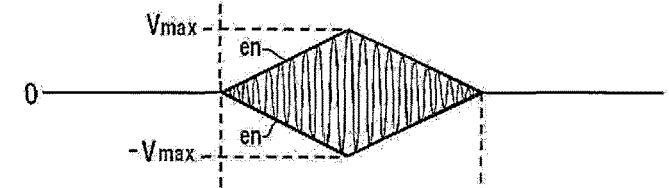
FIG.5D TEST OBJECT APPLIED VOLTAGE (NO INSULATION FAILURE)
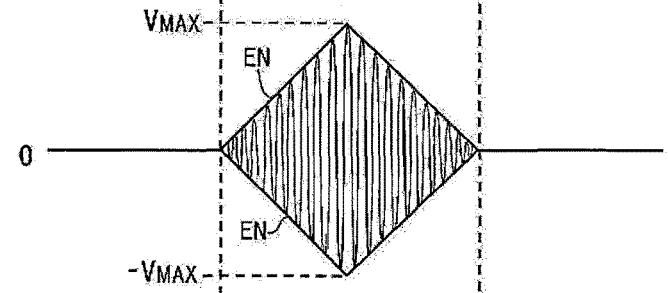
FIG.5E TEST OBJECT APPLIED VOLTAGE (INSULATION FAILURE)
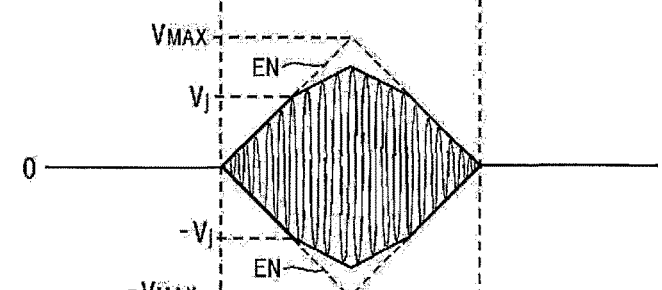
FIG.5F TEST OBJECT APPLIED VOLTAGE (DIELECTRIC BREAKDOWN)
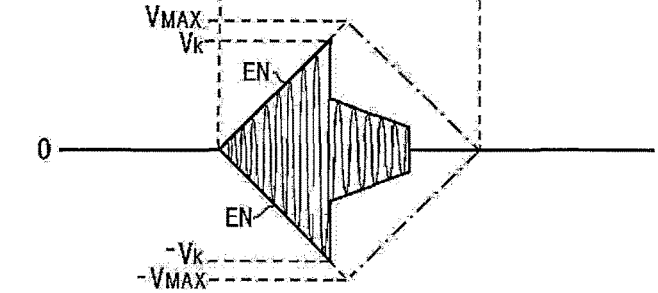

REFERENCE WAVEFORM SIGNAL

HIGH FREQUENCY PULSE

TEST OBJECT APPLIED VOLTAGE

LOAD CURRENT

TEST APPARATUS AND PLASMA PROCESSING APPARATUS

CROSS-REFERENCE TO RELATED APPLICATIONS

This application is based on and claims priority from Japanese Patent Application No. 2013-010968 filed on Jan. 24, 2013 with the Japan Patent Office, and U.S. Provisional Patent Application No. 61/759,474 filed on Feb. 1, 2013 with the USPTO, the disclosures of which are incorporated herein in its entireties by reference.

TECHNICAL FIELD

The present disclosure relates to a test apparatus for testing high frequency voltage dependency of an impedance on a test object having a capacitive or inductive impedance, and a plasma processing apparatus provided with the test apparatus.

BACKGROUND

In a micro-machining or processing such as, for example, etching, deposition, oxidation, sputtering, in a manufacturing process of a semiconductor device or a flat panel display (FPD), plasma is used so as to cause a processing gas to perform a good reaction at a relatively low temperature. In order to generate plasma, a conventional plasma processing apparatus excites and discharges a processing gas within a vacuum processing container by using a high frequency wave or a microwave. The processing gas may be discharged by a high frequency wave in various types such as, for example, a capacitively coupled type discharge in which a high frequency wave is applied between parallel plate electrodes provided within the processing container, and an inductively coupled type discharge in which a high frequency wave is applied to a coil attached spirally or helically around the processing container.

The plasma processing apparatus is configured to apply a high frequency wave of a relatively low frequency to an electrode of a mounting table (susceptor) on which a substrate is placed within a chamber in order to control energy of ions incident on a substrate to be processed from plasma.

The plasma processing apparatus uses various high frequency waves in generating plasma or controlling energy of ions incident on a substrate to be processed from plasma, as described above. Accordingly, a high frequency power feeding line configured to supply a high frequency wave to the processing container is provided such that a predetermined high frequency wave propagation path is set within the processing container. In general, the high frequency power feeding line or the high frequency wave propagation path of the plasma processing apparatus is configured to reach a predetermined ground potential member from a high frequency power source via an electrode within the chamber, and in the middle of the high frequency power feeding line or the high frequency wave propagation path, at least one member having a capacitive or inductive impedance is provided.

For example, a substrate may be held by an electrostatic chuck within the processing container. The electrostatic chuck is a dielectric layer having a conductor layer (e.g., an internal electrode) enclosed therein, and is disposed on a main surface of the susceptor (e.g., at a surface facing the plasma). Then, a predetermined DC voltage is applied to the internal electrode such that the substrate is held by an electrostatic attraction force generated between the substrate and the dielectric layer. As described above, when a high frequency wave for ion attraction is applied to the electrode of the mounting table, the high frequency wave is irradiated to a plasma generating space or a processing space through the electrostatic chuck and the substrate. Here, a considerable high frequency voltage (e.g., 1,000 V or more) is applied to a dielectric material (a capacitive member) of the electrostatic chuck.

In the plasma processing apparatus, a substrate temperature at the time of plasma processing may be controlled at a high response speed. In general, a heater system is employed in which a heating element configured to generate heat by energization is embedded in the electrostatic chuck or the susceptor so as to control joule heat generated by the heating element. In such a heater system, when noise of a high frequency wave introduced into a heater power feeding line through the heating element embedded in the susceptor reaches a heater power source, the operation or performance of the heater power source may be impaired. Therefore, a filter configured to attenuate or block the noise of the high frequency wave on the heater power feeding line is provided. In general, a filter of this type is provided with a coil having a very high inductance. The coil (an inductive member) is also applied with a considerable high frequency voltage (e.g., 1,000 V or more). See, for example, Japanese Patent Laid-Open Publication No. 2009-99858.

SUMMARY

The present disclosure provides a test apparatus of testing a high frequency voltage dependency of an impedance on a test object having a capacitive or inductive impedance. The test apparatus includes: a high frequency power source unit configured to output a high frequency wave having a predetermined frequency in a variable envelope; a control unit configured to control the high frequency power source unit so as to output a high frequency pulse having an envelope portion increasing in a reversed taper shape in a predetermined section on a time axis; a matching unit configured to establish an impedance matching between the high frequency power source unit and the test object; and a monitor unit configured to monitor an envelope waveform of a high frequency voltage applied to the test object according to the high frequency pulse output from the high frequency power source unit.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 5A to 5F are views schematically illustrating waveforms of respective units when a test is performed on a dielectric test object in the test apparatus.

DETAILED DESCRIPTION

Figure 1:
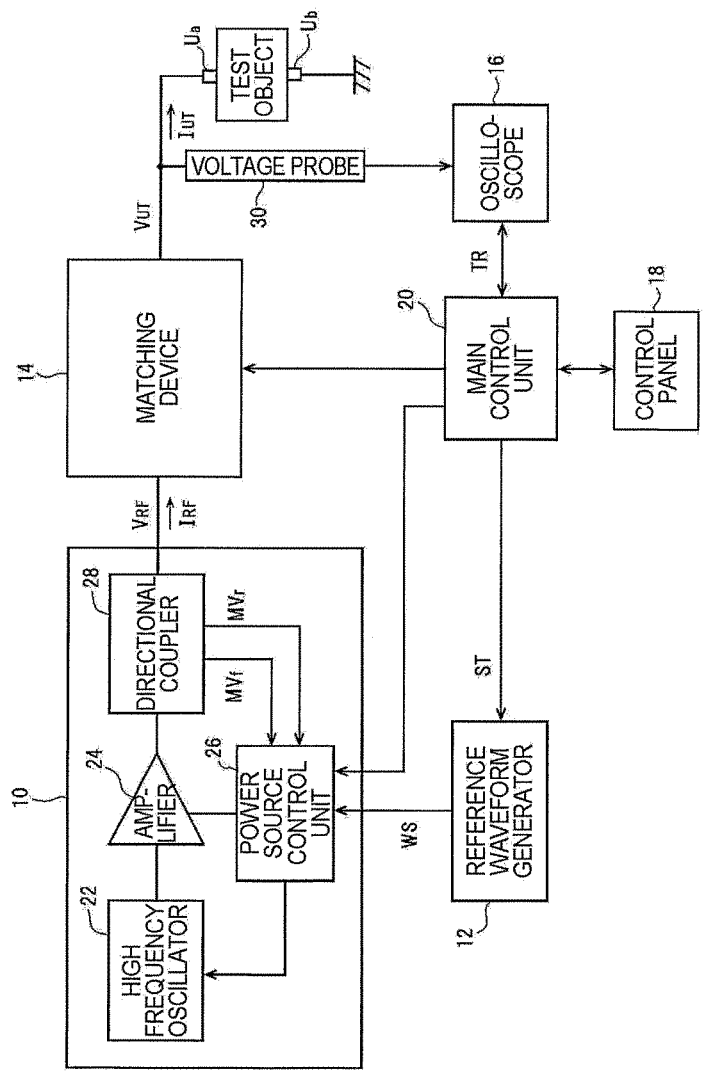
FIG. 1 is a block diagram illustrating a configuration of a test apparatus according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

As for a capacitive or inductive member, such as a dielectric material of an electrostatic chuck or a coil of a high frequency noise blocking filter as described above, through which a high frequency wave is propagated in a plasma processing apparatus, it is required to perform a high frequency withstand voltage test in advance before putting the member in the plasma processing apparatus so as to confirm the voltage withstand performance thereof against a high frequency wave. Also, it is important to minimize individual difference at the time of manufacturing the members without limit. Accordingly, it is necessary to perform the high frequency withstand voltage test for each individual member.

In the high frequency withstand voltage test as described above, a step-up transformer has been used frequently. A high frequency voltage output from a high frequency power source may be boosted n times (10 times) by a step-up transformer of a winding ratio 1:n (e.g., n=10) and then applied to a test object. When the test object is a dielectric material, a voltage drop (secondary voltage) and a load current (secondary current) of the test object are monitored while an RF output of the high frequency power source is gradually increased. Then, a value of the voltage drop of the test object just before the load current is rapidly increased to be short-circuited is determined as a withstand voltage measurement value.

In the high frequency withstand voltage test, since a high frequency wave of an actually operated frequency (e.g., MHz band) is used, a considerable load current flows even if the dielectric test object is not subjected to dielectric breakdown. In this regard, the step-up transformer method is highly disadvantageous in that, since a current, which is n times as high as a load current, flows at the primary side, a large current capacitance, that is, a large high frequency power source is required. Further, a high inrush current may occur due to the inductance of a transformer.

In addition, while a load current continuously flows for a long time in a test object during the test as described above, high frequency voltage dependency of an impedance of the test object may be changed by, for example, heat generation of a leak resistance. This causes a problem in that the measurement accuracy of a dielectric breakdown voltage is low, or a high frequency voltage dependency when an impedance is deteriorated (reduced) by insulation failure prior to the dielectric breakdown may not be accurately monitored. Further, there is a problem in that when the skill of a test operator who monitors a voltage drop of a test object by gradually increasing an RF output of a high frequency power source is not good, the test object may be continuously applied with a high frequency voltage of a value close to a withstand voltage, thereby being damaged.

Meanwhile, it is not necessary to perform a withstand voltage test in terms of dielectric breakdown on an inductive member such as a coil. However, a core containing coil suffers from rapid decrease of the magnetic permeability of the core (in addition, the impedance of the coil) to be ineffective in high frequency blocking function when its temperature exceeds the Curie temperature by heat generation due to core loss. In this regard, the withstand voltage test is required. However, in the conventional set-up transformer type test apparatus as described above, high frequency voltage dependency cannot be accurately monitored when the impedance of the core containing coil is reduced (deteriorated).

The present disclosure has been made to solve the foregoing problems in the related art and provides a test apparatus and a plasma processing apparatus capable of efficiently and accurately testing high frequency voltage dependency of an impedance of a test object without damaging the test object.

A test apparatus according to an aspect of the present disclosure is a test apparatus of testing a high frequency voltage dependency of an impedance on a test object having a capacitive or inductive impedance. The test apparatus includes: a high frequency power source unit configured to output a high frequency wave having a predetermined frequency in a variable envelope; a control unit configured to control the high frequency power source unit so as to output a high frequency pulse having an envelope portion increasing in a reversed taper shape in a predetermined section on a time axis; a matching unit configured to establish an impedance matching between the high frequency power source unit and the test object; and a monitor unit configured to monitor an envelope waveform of a high frequency voltage applied to the test object according to the high frequency pulse output from the high frequency power source unit.

The monitor unit may include an oscilloscope.

The monitor unit may include: a voltage sensor configured to detect an envelope of the high frequency voltage applied to the test object so as to generate an envelope detection signal representing the envelope of the high frequency voltage, and a display unit configured to display the envelope waveform of the high frequency voltage based on the envelope detection signal.

The monitor unit may include: a voltage sensor configured to detect an envelope of the high frequency voltage applied to the test object so as to generate an envelope detection signal representing the envelope of the high frequency voltage, and a signal processing unit configured to perform a signal processing to determine whether a slope of the envelope of the high frequency voltage is bent when the envelope increases in the reversed taper shape in the predetermined section on the time axis, based on the envelope detection signal.

When it is determined that the slope of the envelope of the high frequency voltage is bent, the signal processing unit determines a voltage value of the bent point as a high frequency withstand voltage of the test object.

The control unit may include the control unit includes a reference waveform generator configured to generate a reference waveform signal that defines an envelope waveform of the high frequency pulse, and the high frequency power source unit includes a high frequency oscillator configured to oscillate and output the high frequency wave at a predetermined power, a high frequency power amplifier configured to amplify the high frequency wave output from the high frequency oscillator to a desired power, and a power source control unit configured to variably control a gain of the high frequency power amplifier according to the reference waveform signal generated from the reference waveform generator.

The high frequency power source unit may include a directional coupler that is provided on a high frequency transmission line between the high frequency power amplifier and the matching unit to output a progressive wave detection signal representing a voltage of a progressive wave propagating on the high frequency transmission line in a forward direction, and the power source control unit compares the progressive wave detection signal output from the directional coupler to the reference waveform signal and variably controls the gain of the high frequency power amplifier such that a comparison error is close to zero.

The high frequency power source unit may include a directional coupler that is provided on a high frequency transmission line between the high frequency power amplifier and the matching unit to output a reflected wave detection signal representing a voltage or a power of a reflected wave propagating on the high frequency transmission line in a reverse direction, and the power source control unit stops amplification of the high frequency power amplifier immediately when the voltage or the power of the reflected wave exceeds a predetermined threshold value based on the reflected wave detection signal output from the directional coupler.

The high frequency pulse output from the high frequency power source unit has a triangular envelope waveform.

The high frequency pulse output from the high frequency power source unit has a rhomboid envelope waveform.

In the test apparatus, impedance matching between the high frequency power source unit and the test object is established by a matching device and the high frequency pulse output from the high frequency power source unit at a relatively low power is caused to pass the matching device so that the high frequency pulse may be boosted to a voltage required for the high frequency withstand voltage test to be applied to the test object. Accordingly, it is not necessary to use a step-up transformer, and to provide or prepare a transformer suitable for each impedance of the test object. As a result, the high frequency power source unit may be implemented by an inexpensive and compact unit. In addition, since the required high frequency voltage is applied to the test object only for the pulse duration, the application of the high frequency voltage may be completed without damaging the test object. Further, whether the waveform of the high frequency voltage applied to the test object ("test object applied voltage") is a defined waveform (that is, whether the impedance is unchanged all the time) may be concisely monitored and observed through in a form of a graph. Especially, when, for example, bent, distortion, falling, or missing occurs on a reverse tapered increasing envelope portion of the waveform of the test object applied voltage, details on a high frequency withstand voltage dependency (especially, a high frequency withstand voltage) of the impedance of the test object may be accurately obtained by observing an aspect of deformation of the waveform. Further, since the high frequency voltage of the defined waveform is applied to the test object, stability and reproducibility of the high frequency withstand voltage test may be improved.

A test apparatus according to another aspect of the present disclosure is a test apparatus of testing a high frequency voltage dependency of an impedance on a test object having a capacitive or inductive impedance. The test apparatus includes: a high frequency power source unit configured to output a high frequency wave having a predetermined frequency; a matching unit configured to establish impedance matching between the high frequency power source unit and the test object; a control unit configured to control the high frequency power source unit so as to intermittently output a plurality of high frequency pulses each having an amplitude increasing with elapse of time on a time axis; a voltage measuring unit configured to measure a high frequency voltage applied to the test object according to each of the plurality of high frequency pulses; a current measuring unit configured to measure a high frequency current flowing in the test object according to each of the plurality of high frequency pulses; an impedance calculating unit configured to calculate an impedance measurement value of the test object based on a voltage measurement value and a current measurement value which are obtained from the voltage measuring unit and the current measuring unit, respectively; and a monitoring unit configured to monitor the high frequency voltage dependency of the impedance based on the voltage measurement value obtained from the voltage measuring unit and the impedance measurement value obtained from the impedance calculating unit.

When the impedance measurement value at an $n^{th}$ (n is an integer of 2 or more) high frequency pulse is smaller than the impedance measurement value at an $(n-1)^{th}$ high frequency pulse by a predetermined value or more, the monitoring unit may determine a high frequency withstand voltage of the test object based on at least one of the voltage measurement value at the $(n-1)^{th}$ high frequency pulse and the voltage measurement value at the $n^{th}$ high frequency pulse.

When the impedance measurement value at an $n^{th}$ (n is an integer of 2 or more) high frequency pulse is not smaller than the impedance measurement value at an $(n-1)^{th}$ high frequency pulse by a predetermined value or more and the voltage measurement value at the $n^{th}$ high frequency pulse is larger than a predetermined upper limit voltage value, the monitoring unit determines that the test object is capable of withstanding the upper limit voltage value.

The test object is provided at one path in which a high frequency wave flows in a plasma processing apparatus, and a test is performed on the test object without generating plasma within a chamber of the plasma processing apparatus.

In the test apparatus, the impedance matching between the high frequency power source unit and the test object by a matching device is established and the high frequency pulse output from the high frequency power source unit at a relatively low power is caused to pass the matching device so that the high frequency pulse may be boosted to a voltage required for the high frequency withstand voltage test to be applied to the test object. Accordingly, it is not necessary to use a step-up transformer, and thus, the high frequency power source unit may be implemented by an inexpensive and compact unit. In addition, since the required high frequency voltage is applied to the test object only for the pulse duration, the application of the high frequency voltage may be completed without damaging the test object. Further, since the high frequency voltage of the defined waveform is applied to the test object, stability and reproducibility of the high frequency withstand voltage test may be improved.

A plasma processing apparatus according to the present disclosure includes: a processing container configured to perform plasma processing; a high frequency electrode provided within the processing container to be applied with a high frequency wave during the plasma processing; at least one member having a capacitive or inductive impedance and formed on a predetermined high frequency wave propagation path that extends from a high frequency power source unit to a ground potential member via the high frequency electrode; and the test apparatus according to the present disclosure which tests a high frequency voltage dependency of the impedance on the high frequency wave propagation path as described above.

According to the test apparatus or the plasma processing apparatus of the present disclosure, high frequency voltage dependency of an impedance of the test object may be efficiently and accurately tested without damaging the test object by the above described configurations and operations.

Hereinafter, exemplary embodiments of the present disclosure will be described with reference to accompanying drawings. In the present disclosure, the term of "pulse" or "high frequency pulse" means any waveform in which the amplitude of a voltage is rapidly changed within a short time, and is not limited to a rectangular wave, but includes, for example, a rhomboid wave, a triangular wave (a ramp wave), a sawtooth wave, and a trapezoidal wave.

However, when a test object with a high inductance component is measured, a rhomboid wave is preferable in order to avoid overshoot of an inrush current which may occur at the time of application and at the end of the application.

Configuration of Test Apparatus (Exemplary Embodiment 1)

FIG. 1 illustrates a configuration of a test apparatus according to a first exemplary embodiment of the present disclosure. The test apparatus is configured to test high frequency voltage dependency of an impedance on a given test object having a capacitive or inductive impedance, and basically includes a high frequency power source unit 10, a reference waveform generator 12, a matching device 14, an oscilloscope 16, a control panel 18, and a main control unit 20.

The high frequency power source unit 10 is configured to generate a high frequency pulse for a test, which has a required frequency and a required pulse waveform. The high frequency power source unit 10 is provided with a high frequency oscillator 22, a high frequency power amplifier 24, a power source control unit 26, and a directional coupler 28.

The high frequency oscillator 22 generates a high frequency wave of a constant frequency or a variable frequency as a sine wave. The high frequency power amplifier 24 amplifies an output (power) of the sine wave generated from the high frequency oscillator 22 by a variable gain or an amplification factor. The power source control unit 26 directly controls the high frequency oscillator 22 and the high frequency power amplifier 24 based on a control signal from the main control unit 20. The directional coupler 28 extracts, on a high frequency transmission line between the high frequency power amplifier 24 and the matching device 14, a progressive wave detection signal $MV_f$ and a reflected wave detection signal $MV_r$ which represent a voltage $V_f$ (more precisely, a positive envelope of a progressive wave voltage $V_f$) of a progressive wave propagating in the forward direction, and a voltage $V_r$ (more precisely, a positive envelope of a reflected wave voltage $V_r$) of a reflected wave propagating in the reverse direction, respectively. The progressive wave detection signal $MV_f$ is given, as a feedback signal for waveform control of a high frequency pulse, to the power source control unit 26. The power source control unit 26 includes an error amplifier (not illustrated) configured to generate a comparison error by comparing the progressive wave detection signal $MV_f$ from the directional coupler 28 to a reference waveform signal WS from the reference waveform generator 12 to be described later. The reflected wave detection signal $MV_r$ is given to the power source control unit 26, as a timing signal which limits or stops the output of the high frequency power amplifier 24 when a large reflected wave greater than a predetermined threshold value is propagated from the test object side.

The reference waveform generator 12 is constituted by, for example, a function generator, and generates a reference waveform signal WS having a required waveform such as, for example, a triangular wave, a sawtooth wave, or a rectangular wave. The reference waveform signal WS defines an envelope waveform of a high frequency pulse for a test. The high frequency pulse is output from the high frequency power source unit 10. Here, the high frequency pulse is generally defined as a pulse $V_{RF}$ of a voltage, but may be defined as a pulse of a current or a pulse of a power. The duration or pulse width of the high frequency pulse $V_{RF}$ may be set to be any value, but is generally selected within a range of 0.5 sec to 3 sec. The maximum value or the peak value of the high frequency pulse $V_1$ defines a maximum value of a high frequency voltage which is applied to the test object by the high frequency pulse $V_{RF}$. Accordingly, in the high frequency withstand voltage test on the given test object, the maximum value of the high frequency voltage applied to the test object may be adjusted by adjusting the peak value of the high frequency pulse $V_{RF}$.

The matching device 14 includes a matching circuit including one or more variable reactance elements, and a manual or automatic operation unit configured to variably operate the variable reactance elements in order to establish impedance matching between the high frequency power source unit 10 and the test object. A manual operation unit is configured such that a test operator establishes matching by operating knobs or buttons while monitoring a voltage or a power of the progressive wave/the reflected wave through a measurement device, such that, for example, the voltage or power of the progressive wave is maximized or the voltage or power of the reflected wave is minimized. An automatic operation unit is configured such that an automatic matching mechanism constituted by, for example, a matching controller, an impedance sensor, and a driving unit (motor) is operated to establish matching.

In general, the high frequency power source unit 10 has an output impedance $Z_{RF}$ of 50Ω (net resistance). Accordingly, the electrostatic capacitance or inductance of the variable reactance elements is adjusted to establish impedance matching such that a combined impedance (load impedance) $Z_L$ of the test object and the matching circuit, which is viewed from the high frequency power source unit 10 side, is a net resistance of 50Ω. An output terminal of the matching device 14 is connected to one contact $U_a$ which is in contact with one portion of the test object. A retrace side contact $U_b$ which is in contact with another portion of the test object is grounded.

The oscilloscope 16 is a monitor device configured to observe a waveform of a high frequency voltage applied to the test object, and may be a cathode ray tube oscilloscope or an analog oscilloscope. However, a digital oscilloscope provided with, for example, a memory function for holding or accumulating waveform data, or a communication function for transmitting the waveform data to the main control unit 20 may be suitably used. A high frequency voltage applied to the test object or a test object applied voltage is taken into the oscilloscope 16 via a voltage probe 30.

The main control unit 20 includes one or more microcomputers (CPUs), and controls operations of respective units within the test apparatus, that is, the high frequency power source unit 10, the reference waveform generator 12, the matching device 14, and the oscilloscope 16. The main control unit 20 is connected to the control panel 18 for an man-machine interface including an input device such as, for example, a keyboard, or a display device such as, for example, a liquid crystal display, and an external storage device (not illustrated) that stores or accumulates various programs or various data such as, for example, set values.

Operation of Test Apparatus (Exemplary Embodiment 1)

The test apparatus may boost a high frequency wave which is output at a relatively low power from the high frequency power source unit 10 to a voltage required for the high frequency withstand voltage test and apply the boosted high frequency voltage to the test object in a state where impedance matching is established between the high frequency power source unit 10 and the test object by the matching device 14, that is, under a tuned state.

Figure 2:
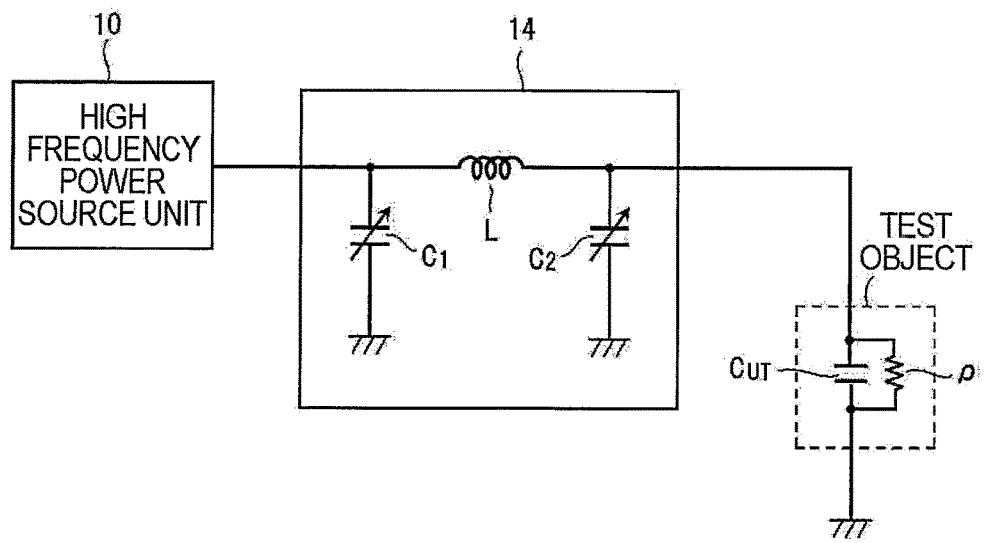
FIG. 2 is a view illustrating a circuit of a load which includes a matching circuit (π-type coupling circuit) and a dielectric test object in the test apparatus.

For example, it is assumed that a case where the matching circuit of the matching device 14 is configured as a π-type coupling circuit, and a high frequency voltage dependency of an impedance is tested on a dielectric test object having an impedance of $Z_{UT}$ ($Z_{UT}=\rho+1/j\omega C_{UT}$) as illustrated in FIG. 2. Here, $C_{UT}$ represents an electrostatic capacitance of a test object, ρ represents a leak resistance of a test object, and ω represents each frequency of high frequency waves used for a test.

Figure 3:
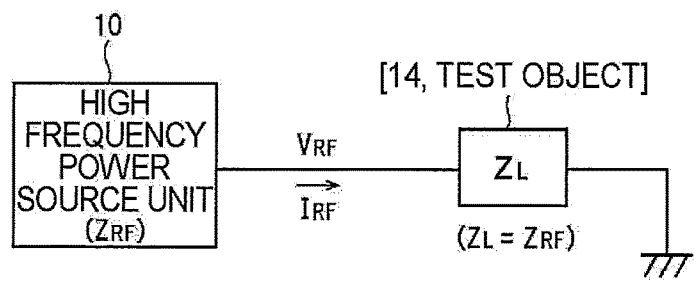
FIG. 3 is a view illustrating an impedance of a load viewed from a high frequency power source unit side when impedance matching is established in the test apparatus.

In the π-type coupling circuit, the electrostatic capacitances of variable condensers $C_1$ and $C_2$ are adjusted by a manual operation or automatic operation as described above, thereby establishing impedance matching. When a tuned state is established in this manner, as illustrated in FIG. 3, the impedance $Z_L$ of a load [the matching device 14 and the test object] viewed from the high frequency power source unit 10 side has the same value as the output impedance $Z_{RF}$ of the high frequency power source unit 10, that is, 50Ω (net resistance). Accordingly, when the RF output of the high frequency power source unit 10 is, for example, 200 W (effective value), a high frequency voltage $V_{RF}$ of 100 V (effective value) and a high frequency current $I_{RF}$ of 2 A (effective value) are input to the matching device 14.

Figure 4:
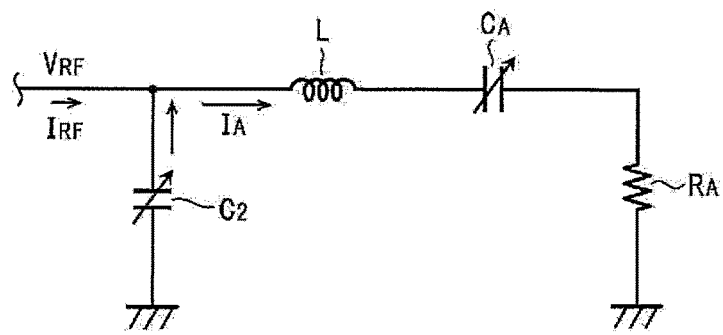
FIG. 4 is a view illustrating an equivalent circuit of a load when impedance matching is established in the test apparatus.

In the equivalent circuit illustrated in FIG. 4, a resistance $R_A$ and a capacitance $C_A$ are represented by Equations (1) and (2) as follows, respectively.

$$R_A = G/(G^2+B^2) \qquad (1)$$

$$C_A = (G^2+B^2)/\omega B \qquad (2)$$

Here, G=1/ρ, B=ω($C_2+C_{UT}$).

FIGS. 5A to 5F illustrate waveforms of respective units when a high frequency voltage dependency (especially, a withstand voltage property) of an impedance is tested on a dielectric test object in the test apparatus.

Before this test, in the matching device 14, a manual or automatic tuning operation is performed to establish impedance matching between the high frequency power source unit 10 and the test object. In the tuning operation, a high frequency wave of a continuous wave is output from the high frequency power source unit 10 at a considerable low power (generally, 10 W or less). At the point of time when the tuned state is established, the high frequency power source unit 10 is turned OFF and at the same time, all variable reactances within the matching device 14 are fixed (locked).

Then, the main control unit 20, as illustrated in FIG. 5A, provides a trigger signal TR to the oscilloscope 16 at a predetermined point of time $t_0$, and then sends a control signal (start signal) ST to the reference waveform generator 12 after a certain delay time $T_s$ (at a point of time $t_1$) to generate a reference waveform signal WS of a triangular wave as illustrated in FIG. 5B. At the same time, the main control unit 20 activates the high frequency power source unit 10.

Within the high frequency power source unit 10, the high frequency oscillator 22 and the power amplifier 24 generate a high frequency wave of a predetermined frequency at a variable power. Then, the power source control unit 26 variably controls a gain of the high frequency power amplifier 24 such that a comparison error is close to zero by comparing the progressive wave detection signal $MV_f$ output from the directional coupler 28 to the reference waveform signal WS output from the reference waveform generator 12. In this manner, a high frequency pulse $V_{RF}$ having a rhomboid waveform defined by the reference waveform signal WS and a peak value $V_{max}$ may be obtained from the high frequency power source unit 10 (FIG. 5C). Here, the high frequency pulse $V_{RF}$ of the rhomboid waveform has an envelope (en) increasing in a reversed taper shape in a certain section (from the start to the intermediate point) on the time axis. The high frequency pulse $V_{RF}$ is caused to pass the matching device 14 which is maintained at the matching state so that the high frequency pulse $V_{RF}$ is boosted approximately $(Z_{UT}/Z_{RF})^{1/2}$ times and the boosted high frequency voltage $V_{UT}$ is applied to the test object.

Here, when the impedance $Z_{UT}$ of the test object is unchanged or constant all the time, that is, the test object withstands the peak value $V_{max}$ of the high frequency voltage $V_{UT}$, the high frequency voltage, that is, the test object applied voltage (or the test object voltage drop) $V_{UT}$ is maintained in a defined rhomboid waveform on the time axis all the time, as illustrated in FIG. 5D.

However, the test object may not withstand the applied voltage $V_{UT}$, thereby causing insulation failure or dielectric breakdown. In general, when the insulation failure occurs, as illustrated in FIG. 5E, the top and bottom portions of the rhomboid waveform are bent to be somewhat crushed at a section where the test object applied voltage $V_{UT}$ exceeds a certain value (insulation failure voltage) $V_J$. When the dielectric breakdown occurs, as illustrated in FIG. 5F, the waveform is collapsed or bent at once (substantially vertically) immediately after the test object applied voltage $V_{UT}$ reaches a certain value (dielectric breakdown voltage) $V_K$. A test operator may observe, on the screen of the oscilloscope 16, the state where the above described waveform of the test object applied voltage $V_{UT}$ is bent in the middle of the waveform (especially, on the reversed taper-shaped inclined portion (EN)), and read the voltage value of the bent point as an insulation failure voltage $V_J$ or a dielectric breakdown voltage $V_K$.

When the waveform of the test object applied voltage $V_{UT}$ is collapsed, the waveform of the high frequency pulse $V_{RF}$ is also affected. When the test object is subjected to dielectric breakdown or considerable insulation failure, the impedance $Z_{UT}$ of the test object is rapidly reduced, and the impedance matching is shifted. Then, from the test object side, a large reflected wave is propagated to the high frequency power source unit 10 through the matching device 14. In the high frequency power source unit 10, the directional coupler 28 detects the voltage (or power) of the reflected wave so that the power source control unit 26 restricts or stops the output of the high frequency power amplifier 24 by, for example, a drooping-type protection circuit.

Figure 6A:
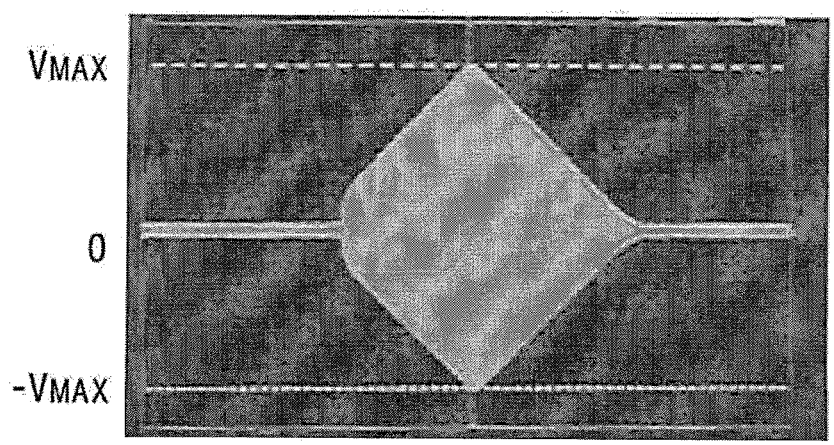
FIG. 6A is a view illustrating an actual waveform (photograph) of a test object applied voltage with no load which is displayed on a screen of an oscilloscope.
Figure 6B:
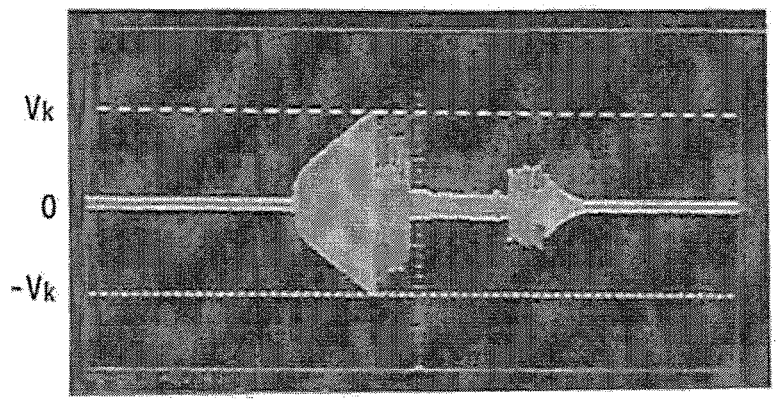
FIG. 6B is a view illustrating an actual waveform (photograph) of a dielectric test object applied voltage which is displayed on a screen of an oscilloscope, when the test object is subjected to a dielectric breakdown.

FIGS. 6A and 6B illustrate actual waveforms (photographs) of test object applied voltages $V_{UT}$ which are displayed on the screen of the oscilloscope 16. The waveform of FIG. 6A is a waveform while the contacts $U_a$ and $U_b$ are not connected to the test object (unloading). The waveform of FIG. 6B is a waveform when a dielectric test object is subjected to dielectric breakdown.

In another exemplary embodiment of the monitor display form, the observed waveform data of a test object applied voltage $V_{UT}$ may be sent to the main control unit 20 from the digital type oscilloscope 16. The main control unit 20 may determine whether the wave form of the test object applied voltage $V_{UT}$ is bent in the middle thereof (on the reversed taper-shaped inclined portion EN) through a signal processing using a predetermined algorithm based on the observed waveform data, so as to determine whether there is insulation failure or dielectric breakdown. Further, the main control unit 20 may read the voltage value of the bent point on the reversed taper-shaped inclined portion EN of the waveform through the signal processing using a predetermined algorithm so as to determine an insulation failure voltage $V_J$ or a dielectric breakdown voltage $V_K$. Then, information of a monitoring result may be displayed and output on the control panel 18.

Figure 7:
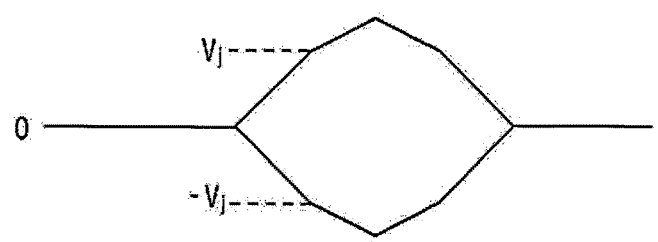
FIG. 7 is a view illustrating an example of a case where an envelope waveform which does not include an AC waveform of a test object applied voltage is displayed and output.

In such a case, as illustrated in FIG. 7, an envelope waveform which does not include a sinusoidal waveform of the high frequency of a test object applied voltage $V_{UT}$ may be output and displayed. Alternatively, a monitor outputting method, in which no observation on the waveform of the test object applied voltage $V_{UT}$ is performed at all, may be used. For example, when the rhomboid waveform of the test object applied voltage $V_{UT}$ is maintained without causing any of insulation failure and dielectric breakdown, the monitored result of that effect (e.g., "OK") may be displayed and output by lamp lighting or character information, or the peak voltage $V_{MAX}$ (withstanding voltage) of the rhomboid waveform may be displayed and output by character information. When insulation failure or dielectric breakdown occurs, the monitored result of that effect (e.g., "NG") may be displayed and output by lamp lighting or character information, or an insulation failure voltage $V_J$ or a dielectric breakdown voltage $V_K$ may be displayed and output by character information.

In the test apparatus, when the test object is an inductive member, for example, a core containing coil, it is desirable to configure the matching circuit of the matching device 14 as a T-type coupling circuit, although not illustrated. In that event, prior to the high frequency withstand voltage test, a tuning operation is also performed in the matching device 14. That is, the electrostatic capacitance or inductance of the variable reactance elements of the T-type coupling circuit is adjusted by a manual operation or an automatic operation, thereby establishing impedance matching. Accordingly, the impedance $Z_L$ of a load [the matching device 14 and the test object] viewed from the high frequency power source unit 10 side has the same value as the output impedance $Z_{RF}$ of the high frequency power source unit 10, that is, 50Ω (net resistance) (FIG. 3).

Then, in the same manner as described above, under the control of the main control unit 20, the high frequency power source unit 10 outputs a high frequency pulse $V_{RF}$ having a rhomboid envelope waveform defined by the reference waveform signal WS such that the oscilloscope 16 observes and displays the waveform of the test object applied voltage $V_{UT}$.

Figure 8A:
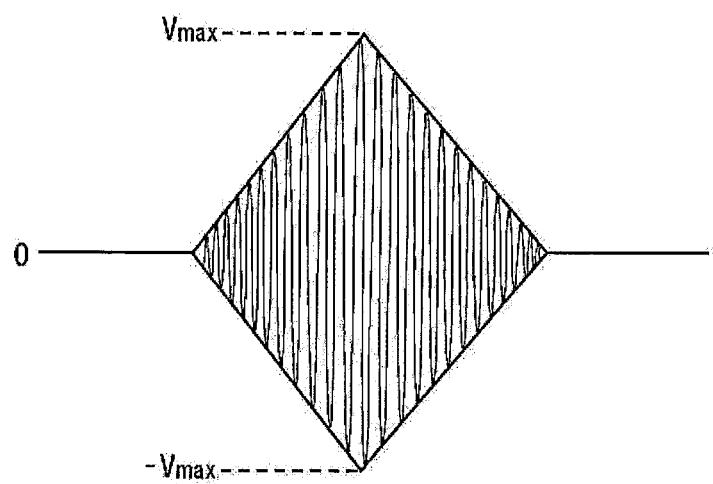
FIG. 8A is a view schematically illustrating a voltage waveform displayed on a screen of an oscilloscope when a core containing coil (test object) withstands a test object applied voltage of a rhomboid waveform in the test apparatus.

Also, in this case, when the impedance $Z_{UT}$ ($Z_{UT} \approx j\omega L$ in which L represents an inductance) of the test object (the core containing coil) is unchanged or constant all the time during the application of the high frequency voltage $V_{UT}$, that is, the test object (the core containing coil) withstands the peak value $V_{MAX}$ of the high frequency voltage $V_{UT}$, the test object applied voltage (voltage drop) $V_{UT}$ has a well-regulated rhomboid waveform as illustrated in FIG. 8A.

Figure 8B:
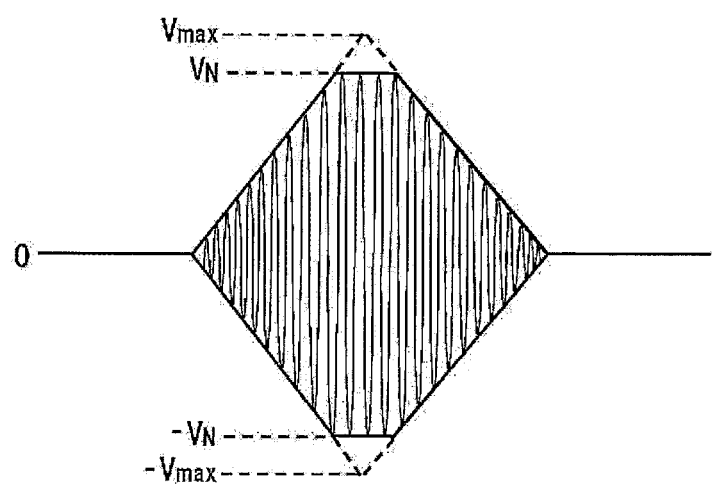
FIG. 8B is a view schematically illustrating a voltage waveform displayed on a screen of an oscilloscope when a core containing coil (test object) cannot withstand a test object applied voltage of a rhomboid waveform in the test apparatus.

However, in the core containing coil, when a temperature of heat generation caused by high frequency energization is higher than the Curie temperature, the magnetic permeability of the core is abruptly decreased so that an inductance, i.e., an impedance is rapidly reduced. When this phenomenon occurs during the application of the high frequency voltage $V_{UT}$, the waveform is bent such that the test object applied voltage $V_{UT}$ is saturated at a certain value (breakdown voltage) $V_N$ and $-V_N$ (that is, top and bottom portions of the waveform are cut out), as illustrated in FIG. 8B. A test operator may observe, on the screen of the oscilloscope 16, the state where the waveform of the test object applied voltage $V_{UT}$ is bent as described above, and read a breakdown voltage or a high frequency withstand voltage $V_N$.

Figure 9:
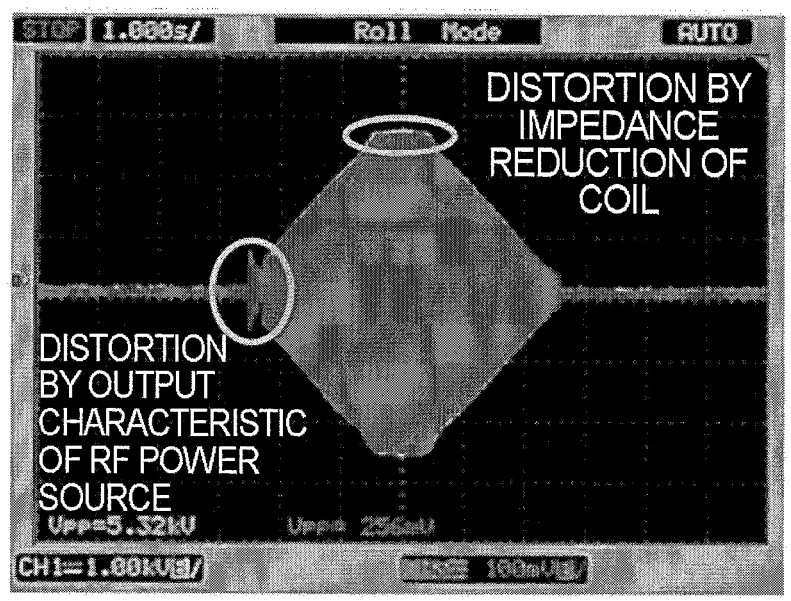
FIG. 9 is a view illustrating an actual waveform (photograph) of a test object applied voltage which is displayed on a screen of an oscilloscope.

FIG. 9 illustrates an actual voltage waveform (photograph) displayed on the screen of the oscilloscope 16 in which the voltage is the test object applied voltage $V_{UT}$, when the test object is a core containing coil (a toroidal coil).

In another monitor display form, the observed waveform data of the test object applied voltage $V_{UT}$ may be sent to the main control unit 20 from the digital type oscilloscope 16. The main control unit 20 may determine and evaluate the high frequency voltage dependency or the high frequency withstand voltage property of the impedance of the core containing coil through a signal processing using a predetermined algorithm based on the observed waveform data, and further determine the breakdown voltage or the high frequency withstand voltage $V_N$ to display and output the monitored result information on the control panel 18. Also, in this case, an envelope waveform which does not include a sinusoidal waveform of the high frequency wave of the test object applied voltage $V_{UT}$ may be displayed and output through the display unit of the control panel 18, or the monitored result may be displayed and output by character information.

Meanwhile, instead of the oscilloscope 16, a voltage sensor (not illustrated) configured to detect an envelope of the test object applied voltage $V_{UT}$ may be provided such that an envelope detection signal obtained from the voltage sensor may be sent to the main control unit 20, and in the main control unit 20, the above described signal processing may be performed to display and output monitored result information on the control panel 18.

The test apparatus performs observation of the waveform of the test object applied voltage $V_{UT}$ once by using a single high frequency pulse $V_{RF}$ having a predetermined set voltage as a basic test mode. However, for example, another test mode may be performed in which observation of the waveform of the test object applied voltage $V_{UT}$ is performed successively and repeatedly by using a plurality of high frequency pulses $V_{RF}$ having a peak value $V_{MAX}$ sequentially and stepwise increasing from a relatively low value until the high frequency withstand voltages $V_J$, $V_K$, $V_N$ of the test object are determined.

As described above, in the test apparatus according to the exemplary embodiment, impedance matching is established between the high frequency power source unit 10 and the test object by the matching device 12 and the high frequency pulse $V_{RF}$ output at a relatively low power from the high frequency power source unit 10 is caused to pass the matching device 12 so that the high frequency pulse $V_{RF}$ may be boosted to a voltage $V_{UT}$ required for the high frequency withstand voltage test to be applied to the test object. Accordingly, it is not necessary to use a step-up transformer, and thus the high frequency power source unit 10 may be implemented by an inexpensive and compact unit.

Since the high frequency voltage $V_{UT}$ required for the test object is applied within a short time of several seconds or less, the test may be completed without damaging the test object. Whether the waveform of the test object applied voltage $V_{UT}$ is a rhomboid waveform (that is, whether the impedance is unchanged all the time) may be concisely monitored and observed through in a form of a graph. When, for example, bent, distortion, falling, or missing occurs on the reversed taper-shaped inclined portion EN of the waveform of the test object applied voltage $V_{UT}$, details on a high frequency withstand voltage dependency (especially, a high frequency withstand voltage) of the impedance of the test object may be accurately obtained by observing the aspect of deformation of the waveform. Further, since the high frequency voltage $V_{UT}$ of the rhomboid waveform is applied to the test object, stability and reproducibility of the high frequency withstand voltage test may be improved.

Configuration of Test Apparatus (Exemplary Embodiment 2)

Figure 10:
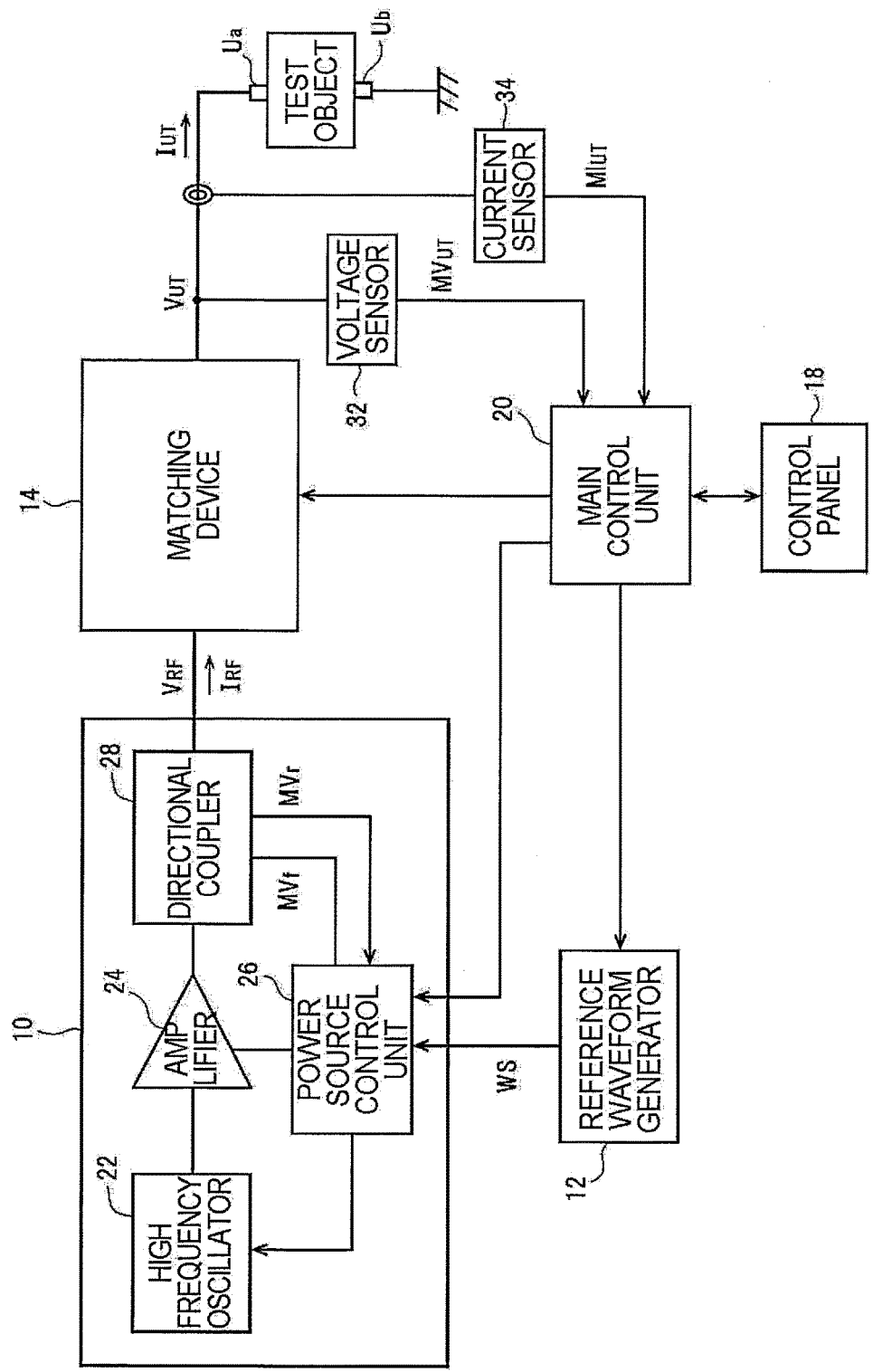
FIG. 10 is a block diagram illustrating a configuration of a test apparatus according to a second exemplary embodiment.

FIG. 10 illustrates a configuration of a test apparatus according to a second exemplary embodiment. The test apparatus includes a voltage sensor 32 configured to measure a high frequency voltage $V_{UT}$ applied to a test object, and a current sensor 34 configured to measure a load current $I_{UT}$ flowing in the test object, as a monitor unit, instead of the oscilloscope 16 (FIG. 1). Other components have a configuration identical or similar to those of the test apparatus (FIG. 1) in the above described first exemplary embodiment.

In the test apparatus, a high frequency pulse $V_{RF}$ of a rectangular wave is generated from the high frequency power source unit 10. Accordingly, the reference waveform generator 12 generates a reference waveform signal WS of the rectangular wave. The voltage sensor 32 may measure the peak value $V_{MAX}$ (or peak to peak value $V_{pp}$) of the high frequency voltage $V_{UT}$. However, the voltage sensor 32 may be a voltage measurement device configured to measure an effective value or an average value of the high frequency voltage $V_{UT}$. The current sensor 34 may measure the peak value $V_{MAX}$ (or peak to peak value $I_{pp}$) of the load current $I_{UT}$. However, the current sensor 34 may be a current measurement device configured to measure an effective value or an average value of the load current $I_{UT}$. A voltage measurement signal $MV_{MAX}$ and a current measurement signal $MI_{MAX}$ are respectively output from the voltage sensor 32 and the current sensor 34 and provided to the main control unit 20.

Operation of Test Apparatus (Exemplary Embodiment 2)

Figure 11:
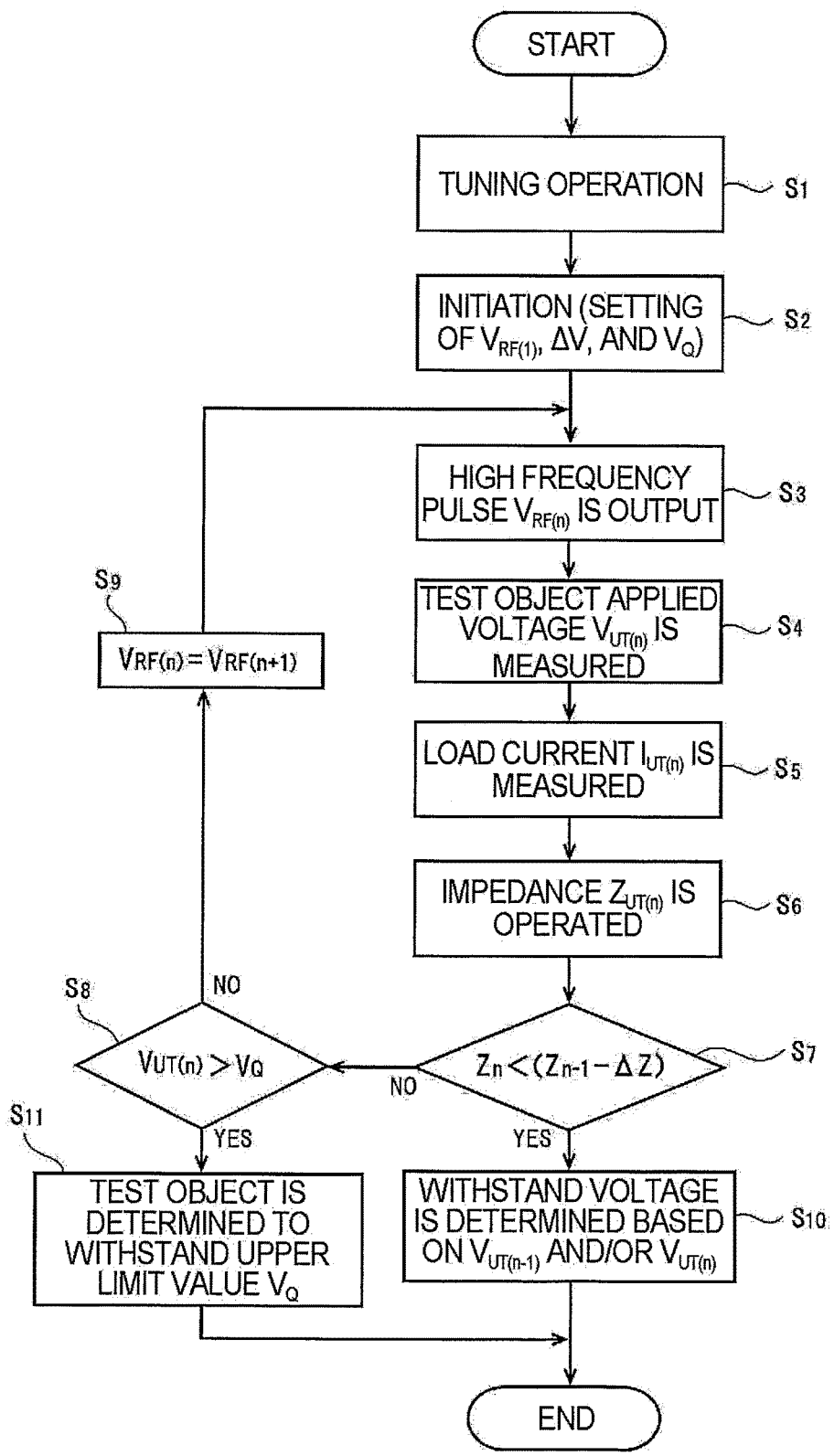
FIG. 11 is a flow chart illustrating a sequence of a high frequency voltage dependency test of an impedance on a given test object, which is performed by the test apparatus of FIG. 10.
Figure 12A:
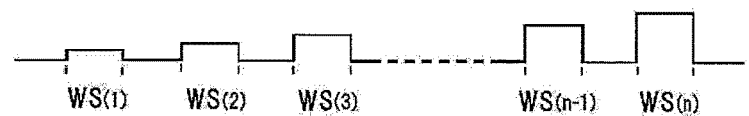
FIGS. 12A to 12D are views schematically illustrating waveforms of respective units within the apparatus in the test.
Figure 12B:
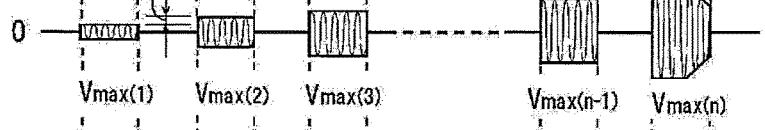
Figure 12C:
Figure 12D:
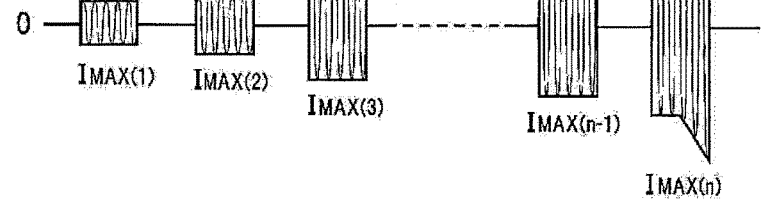

FIG. 11 illustrates a sequence of a high frequency voltage dependency test of an impedance on a given test object when the high frequency voltage dependency test is performed by the test apparatus (especially, a control or calculation processing sequence in a CPU of the main control unit 20).

The tuning operation (step $S_1$) is the same as that in the first exemplary embodiment as described above, and is performed by a manual operation or an automatic operation in the matching device 14 prior to the energization test. After the tuning operation, initialization in the main control unit 20 is performed so as to set an initial value $V_{MAX(1)}$ and a step-up value $\Delta V$ of the peak value $V_{MAX}$ of the high frequency pulse $V_{RF}$ (step $S_2$). The initial value $V_{MAX(1)}$ is set as a low voltage value that has little effect on the impedance of the test object.

When receiving an instruction to start the test through, for example, the control panel 18 from a test operator, the main control unit 20 controls the high frequency power source unit 10 and the reference waveform generator 12 to generate a first high frequency pulse $V_{RF(1)}$ of a rectangular wave having a peak value of an initial value $V_{MAX(1)}$ (step $S_3$). The high frequency pulse $V_{RF(1)}$ of the rectangular wave is caused to pass the matching device 14 so that a boosted high frequency voltage $V_{UT}$ of a rectangular wave is applied to the test object. By the voltage sensor 32 and the current sensor 34, peak values $V_{MAX}$ and $I_{MAX}$ of a test object applied voltage $V_{UT(0)}$ and a load current $T_{UT(0)}$ are measured, respectively (steps $S_4$ and $S_5$). The main control unit 20 calculates an impedance $Z_{UT(1)}$ of the test object at the first high frequency pulse $V_{RF(1)}$ based on the voltage measurement signal $MV_{MAX}$ and the current measurement signal $MI_{MAX}$ from the voltage sensor 32 and the current sensor 34 (step $S_6$).

The main control unit 20 compares the impedance $Z_{UT(1)}$ of the test object to an impedance $Z_{UT(0)}$ of the test object at the previous high frequency pulse (step $S_7$). However, at the first time, since there is no previous time, a virtual impedance $Z_{UT(0)}$ of the test object is set as a very large default value, or the test object applied voltage $V_{UT(1)}$ of the first time is unconditionally compared to an upper limit voltage value $V_Q$ for the high frequency withstand voltage test (step $S_8$). In this case, since the test object applied voltage $V_{UT(1)}$ of the first time is considerably low, the condition of $V_{UT(1)} < V_Q$ is necessarily satisfied. Accordingly, the peak value of the high frequency pulse $V_{RF}$ is updated from $V_{max(1)}$ to $V_{max(2)}$ (step $S_8$). Here, $V_{max(2)} = V_{max(1)} + \Delta V$.

Then, the high frequency power source unit 10 outputs a second high frequency pulse $V_{RF(2)}$ of a rectangular wave having the peak value $V_{max(2)}$ (step $S_3$), and the high frequency pulse $V_{RF(2)}$ is processed in the same manner as described above (steps $S_3$ to $S_8$). However, in step $S_7$, it is determined whether the impedance $Z_{UT(2)}$ of the test object at the present time (the second time) is reduced by a predetermined value $\Delta Z$ or more as compared to the impedance $Z_{UT(1)}$ of the test object at the previous time (the first time). In general, at the second time, the condition of $Z_{UT(2)} < Z_{UT(1)} - \Delta Z$ is not satisfied.

In this manner, the peak value $V_{max}$ of a high frequency pulse $V_{RF(n)}$ of a rectangular wave (n is an integer of 2 or more) is increased stepwise by $\Delta V$ while a boosted high frequency voltage $V_{UT}$ of a rectangular wave is applied to the test object. Then, it is monitored whether the impedance $Z_{UT(n)}$ of the test object at the present time has the substantially same value as the impedance $Z_{UT(n-1)}$ of the test object at the high frequency pulse $V_{RF(n-1)}$ at the previous time by the CPU within the main control unit 20 through the voltage sensor 31 and the current sensor 34.

When the impedance measurement value $Z_{UT(n)}$ at the high frequency pulse $V_{RF(n)}$ at the present time ($n^{th}$) is lower than the impedance measurement value $Z_{UT(n-1)}$ at the high frequency pulse $V_{RF(n-1)}$ at the previous time by $\Delta Z$ or more (that is, in step $S_7$, the condition of $Z_{UT(2)} < Z_{UT(1)} - \Delta Z$ is satisfied), the high frequency withstand voltages $V_j$, $V_k$, $V_N$ of the test object are determined based on the voltage measurement value $V_{UT(n-1)}$ at the high frequency pulse $V_{RF(n-1)}$ at the previous time or the voltage measurement value $V_{UT(n)}$ at the high frequency pulse $V_{RF(n)}$ at the present time (step $S_7 \rightarrow S_{10}$). That is, as the high frequency withstand voltages $V_j$, $V_k$, $V_N$, either the voltage measurement value $V_{UT(n)}$ or the $V_{UT(n-1)}$ may be selected, or an intermediate value or an average value thereof may be selected.

When the impedance measurement value $Z_{UT(n)}$ at the high frequency pulse $V_{RF(n)}$ at the present time is not lower than the impedance measurement value $Z_{UT(n-1)}$ at the high frequency pulse $V_{RF(n-1)}$ at the previous time by $\Delta Z$ or more, and the voltage measurement value $V_{UT(n)}$ at the high frequency pulse $V_{RF(n)}$ at the present time exceeds an upper limit voltage value $V_Q$, it is determined that the test object has withstood the upper limit voltage value $V_Q$ (step $S_8 \rightarrow S_{11}$).

Meanwhile, in the test apparatus of the present exemplary embodiment, since the high frequency pulse $V_{RF}$ output from the high frequency power source unit 10 is a rectangular wave, a precise waveform control is not necessary. Accordingly, the reference waveform generator 12 may be omitted and the control of the high frequency pulse $V_{RF}$ may be performed within the high frequency power source unit 10.

Configuration of Plasma Processing Apparatus

Figure 13:
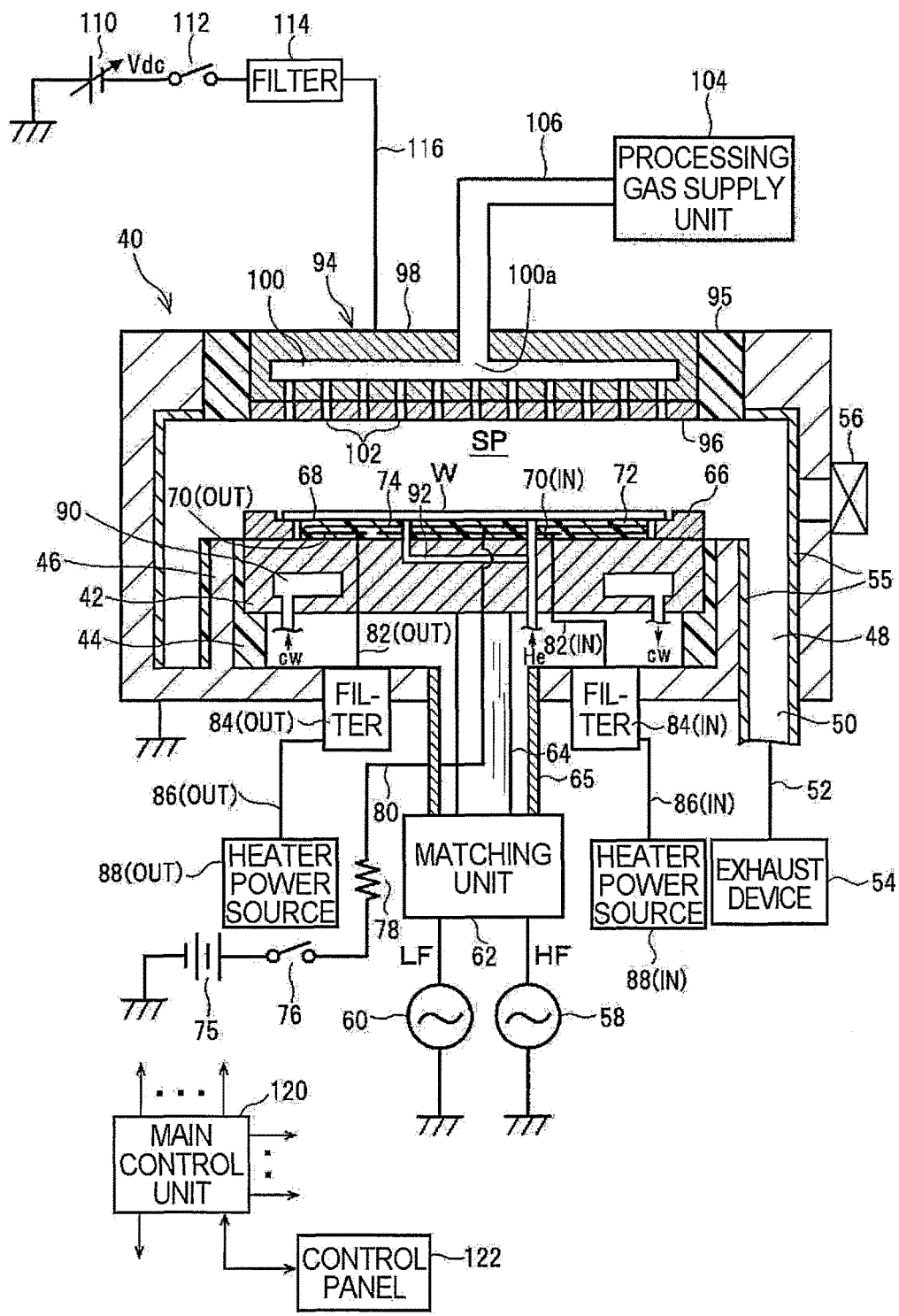
FIG. 13 is a view illustrating a configuration of a plasma processing apparatus according to a third exemplary embodiment.

FIG. 13 illustrates a configuration of a plasma processing apparatus according to another exemplary embodiment of the present disclosure. The plasma processing apparatus is configured as a capacitive coupling plasma etching apparatus of a lower-side two-frequency application type, and includes a cylindrical chamber (processing container) 40 made of a metal such as, for example, aluminum or stainless steel. The chamber 40 is grounded.

Within the chamber 40, a disk shaped susceptor 42 on which, for example, a semiconductor wafer W as a substrate to be processed is placed is horizontally disposed as a lower electrode. The susceptor 42 is made of, for example, aluminum, and is supported in an ungrounded manner by an insulative cylindrical supporting unit 44 which extends vertically upwardly from the bottom of the chamber 40, and is made of, for example, ceramic. A conductive cylindrical supporting unit 46 extends vertically and upwardly along the outer periphery of the insulative cylindrical supporting unit 44 from the bottom of the chamber 40. An annular exhaust path 48 is formed between the conductive cylindrical supporting unit 46 and the inner wall of the chamber 40, and an exhaust hole 50 is formed at the bottom of the exhaust path 48. An exhaust device 54 is connected to the exhaust hole 50 via an exhaust pipe 52. The exhaust device 54 includes a vacuum pump such as, for example, a turbo molecular pump, and may decompress the processing space within the chamber 40 to a desired vacuum degree. A gate valve 56 configured to open/close a carrying-in/out port of the semiconductor wafer W is attached to the outer wall of the chamber 40. A deposition shield or deposition-preventive plate 55 is attached to the inner wall of the chamber 40.

First and second high frequency power sources 58 and 60 are electrically connected to the susceptor 42 via a matching unit 62 and a power feeding rod 64. Here, the first high frequency power source 58 outputs a first high frequency wave HF of a certain frequency (generally, 27 MHz or more) which mainly contributes to generation of plasma. The second high frequency power source 60 outputs a second high frequency wave LF of a certain frequency (generally, 13 MHz or less) which mainly contributes to ion attraction to the semiconductor wafer W on the susceptor 42. A first matching device 130 (FIG. 14) and a second matching device (not illustrated) to be described later, which are configured to establish impedance matching between the first and second high frequency power sources 58 and 60 and a plasma load, are accommodated in the matching unit 62.

The power feeding rod 64 is constituted by a cylindrical or columnar conductor having a predetermined outer diameter, and has a top end connected to a central portion of the bottom surface of the susceptor 42, and a bottom end connected to a high frequency output terminal of each of the first matching device 130 (FIG. 14) and the second matching device within the matching unit 62. A cylindrical conductor cover 65 configured to surround the periphery of the power feeding rod 64 is provided between the bottom surface of the chamber 40 and the matching unit 62. More specifically, a circular opening having a predetermined diameter that is much larger than the outer diameter of the power feeding rod 64 is formed at the bottom surface (lower surface) of the chamber 10. The top end of the conductor cover 65 is connected to the chamber opening and the bottom end of the conductor cover 65 is connected to a grounding (retrace) terminal of the matching unit 62.

The susceptor 42 has a diameter or caliber that is much larger than the semiconductor wafer W. The top surface of the susceptor 42 is partitioned into a central area having the substantially same shape (circular shape) and the substantially same size as the wafer W, that is, a wafer placement portion, and an annular peripheral portion extending toward the outside of the wafer placement portion. On the wafer placement portion, the semiconductor wafer W to be processed is placed. On the annular peripheral portion, a ring-shaped plate member, that is, a so-called focus ring 66 is attached. The focus ring 66 has an inner diameter larger than the diameter of the semiconductor wafer W. The focus ring 66 is made of any one material of, for example, Si, SiC, C and $SiO_2$, according to the material to be etched on the semiconductor wafer W.

An electrostatic chuck 68 for wafer attraction and a heating element 70 are provided on the wafer placement portion on the top surface of the susceptor 42. The electrostatic chuck 68 encloses a DC electrode 74 in a film-shaped or plate-shaped dielectric material 72 integrally formed on or fixed to the top surface of the susceptor 42, and the DC electrode 74 is electrically connected to an external DC power source 75 disposed outside the chamber 40 via a switch 76, a resistor 78 with a high resistance value, and a DC high voltage wire 80. A high DC voltage is applied to the DC electrode 74 from the DC power source 75, by which the semiconductor wafer W is attracted to and held on the electrostatic chuck 68 by an electrostatic force. The DC high voltage wire 80 is a coated wire, and penetrates the susceptor 42 from the lower side through the inside of the cylindrical power feeding rod 64 to be connected to the DC electrode 74 of the electrostatic chuck 68.

The heating element 70 includes, for example, a spiral resistance heating wire which is enclosed, together with the DC electrode 74 of the electrostatic chuck 68, within the dielectric material 72, and is divided into an inside heating wire 70(IN) and an outside heating wire 70(OUT) in the radial direction of the susceptor 42 in the present exemplary embodiment. The inside heating wire 70(IN) is electrically connected to a dedicated heater power source 88(IN) disposed outside the chamber 40 via an insulation-coated power supply conductor 82(IN), a filter unit 84(IN) and an electric cable 86(IN). The outside heating wire 70(OUT) is also electrically connected to a dedicated heater power source 88(OUT) disposed outside the chamber 40, via an insulation-coated power supply conductor 82(OUT), a filter unit 84(OUT), and an electric cable 86(OUT).

An annular coolant chamber or passage 90 which extends, for example, in the circumferential direction is formed within the susceptor 42. The coolant chamber 90 is supplied with a coolant, for example, a cooling water cw, of a predetermined temperature via a coolant supply pipe from a chiller unit (not illustrated) in circulation. By the temperature of the coolant, the temperature of the susceptor 42 may be controlled to be reduced. In order to thermally couple the semiconductor wafer W to the susceptor 42, a heat transfer gas, for example, He gas is supplied from a heat transfer gas supply unit (not illustrated) to a contact interface between the electrostatic chuck 68 and the semiconductor wafer W via a gas supply pipe and a gas passage 92 within the susceptor 42.

A shower head 94 serving as an upper electrode is attached to the ceiling of the chamber 40 via a ring-shaped insulator 95 to face the susceptor 42 in parallel to the susceptor 42. The shower head 94 includes an electrode plate 96 facing the susceptor 42, and an electrode support 98 configured to detachably support the electrode plate 96 from behind (above) the electrode plate 96. A gas chamber 100 is provided within the electrode support 98, and a plurality of gas ejecting holes 102 penetrating from the gas chamber 100 to the susceptor 42 side are formed in the electrode support 98 and the electrode plate 96. A space SP between the electrode plate 96 and the susceptor 42 is set as a plasma generating space or a processing space. A gas supply pipe 106 extending from a processing gas supply unit 104 is connected to a gas inlet port 100a formed at the top of the gas chamber 100. The electrode plate 96 is made of, for example, Si, SiC, $SiO_2$ or C, and the electrode support 98 is made of, for example, aluminum subjected to alumite treatment.

The plasma etching apparatus is provided with a DC power source 110 configured to apply a negative, preferably, a variable DC voltage $V_{dc}$ to the upper electrode 94. The output terminal of the DC power source unit 110 is electrically connected to the upper electrode 94 via a switch 112, a filter circuit 114, and a DC power feeding line 116. The filter circuit 114 is configured to apply the DC voltage $V_{dc}$ from the DC power source 110 to the upper electrode 96, and allow a high frequency wave, which enters the DC power feeding line 116 from the susceptor 42 via the processing space SP and the upper electrode 94, to flow into a ground line rather than the DC power source 110.

At an appropriate position facing the processing space SP within the chamber 40, a DC ground part (not illustrated) made of a conductive material such as, for example, Si or SiC, is attached. The DC ground part is always grounded via a ground line (not illustrated).

A main control unit 120 controls individual operations of the respective units within the plasma etching apparatus, for example, the exhaust device 54, the high frequency power sources 58 and 60, the matching unit 62, the switch 76 of the DC power source 75, the heater power sources 88(IN) and 88(OUT), the chiller unit (not illustrated), the heat transfer gas supply unit (not illustrated), and the processing gas supply unit 104, and the overall operation (sequence) of the apparatus. The main control unit 120 is connected to a control panel 122 for an man-machine interface including an input device such as, for example, a keyboard, or a display device such as, for example, a liquid crystal display, and an external storage device (not illustrated) that stores or accumulates various programs or various data such as, for example, set values.

A basic operation for single-wafer dry etching in the plasma etching apparatus is performed as follows. First, the gate valve 56 is opened while the semiconductor wafer W to be processed is carried into the chamber 40 to be placed on the electrostatic chuck 68. An etching gas (generally, a mixed gas) is introduced into the chamber 40 from the processing gas supply unit 104 at a predetermined flow rate, and the pressure within the chamber 40 is set to a set value by the exhaust device 54. The first high frequency wave HF and the second high frequency wave LF are output at a predetermined power by turning ON the first and second high frequency power sources 58 and 60, respectively, to be applied to the susceptor (lower electrode) 42 via the matching unit 62 and the power feeding rod 64. Then, a heat transfer gas (He gas) is supplied from the heat transfer gas supply unit to the contact interface between the electrostatic chuck 68 and the semiconductor wafer W, and the switch 76 for the electrostatic chuck is turned ON such that the heat transfer gas is confined in the contact interface by the electrostatic attraction force. Each of the inside heating wire 70(IN) and the outside heating wire 70(OUT) is independently heated by Joule heat by turning ON the heater power sources 88(IN) and 88(OUT) to control the temperature or the temperature distribution of the top surface of the susceptor 42 to be the set value. The etching gas ejected from the shower head 94 is turned into plasma by discharge of a high frequency wave between both electrodes 42 and 94, and a processed film on the surface of the semiconductor wafer W is etched into a desired pattern by radicals or ions generated by the plasma.

In the plasma etching apparatus, in the middle of the etching process, the high frequency waves HF and LF applied to the susceptor 42 from the high frequency power sources 58 and 60 are partially introduced to the heater power feeding lines 82(IN) and 82(OUT) via the heating wires 70(IN) and 70(OUT) of the heating element 70. However, the coils provided within the filter units 84(IN) and 84(OUT) are configured to block the noise of the introduced high frequency waves HF and LF.

In the plasma processing apparatus, for example, the dielectric material 72 of the electrostatic chuck 68, the electrode plate 96 of the upper electrode (shower head) 94, the insulative cylindrical supporting unit 44, and the deposition-preventive plate 55 are members or parts having a capacitive impedance which are provided within a high frequency wave propagation path. The coils within the filter unit 84(IN) and 84(OUT) are members or parts having an inductive impedance which are provided within the high frequency wave propagation path. Accordingly, before placed in the apparatus, these capacitive or inductive members or parts may be subjected to a high frequency withstand voltage test by the above described test apparatus as an independent unit (FIG. 1 and FIG. 10).

Figure 14:
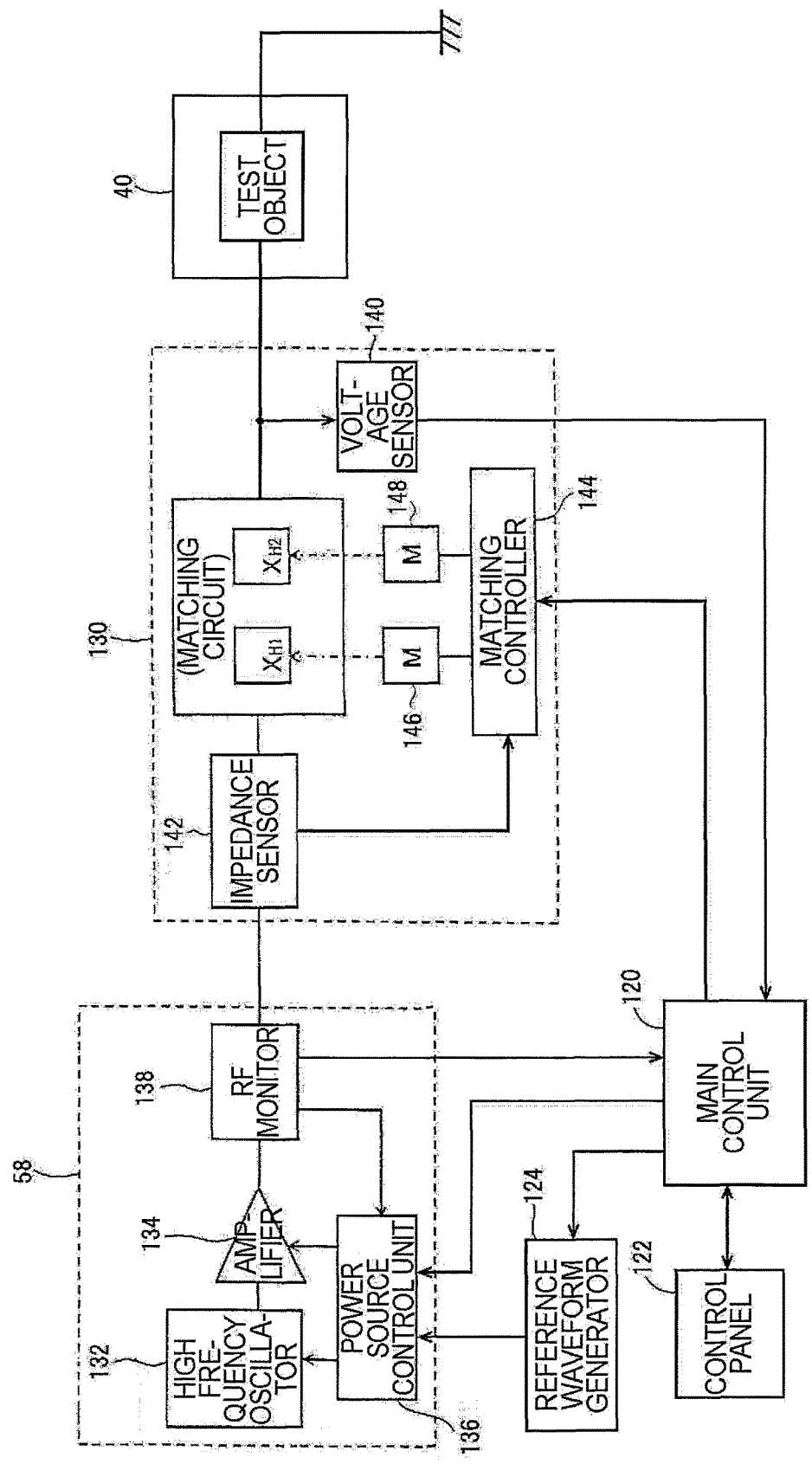
FIG. 14 is a block diagram illustrating a configuration example of a test unit in the plasma processing apparatus.
Figure 15:
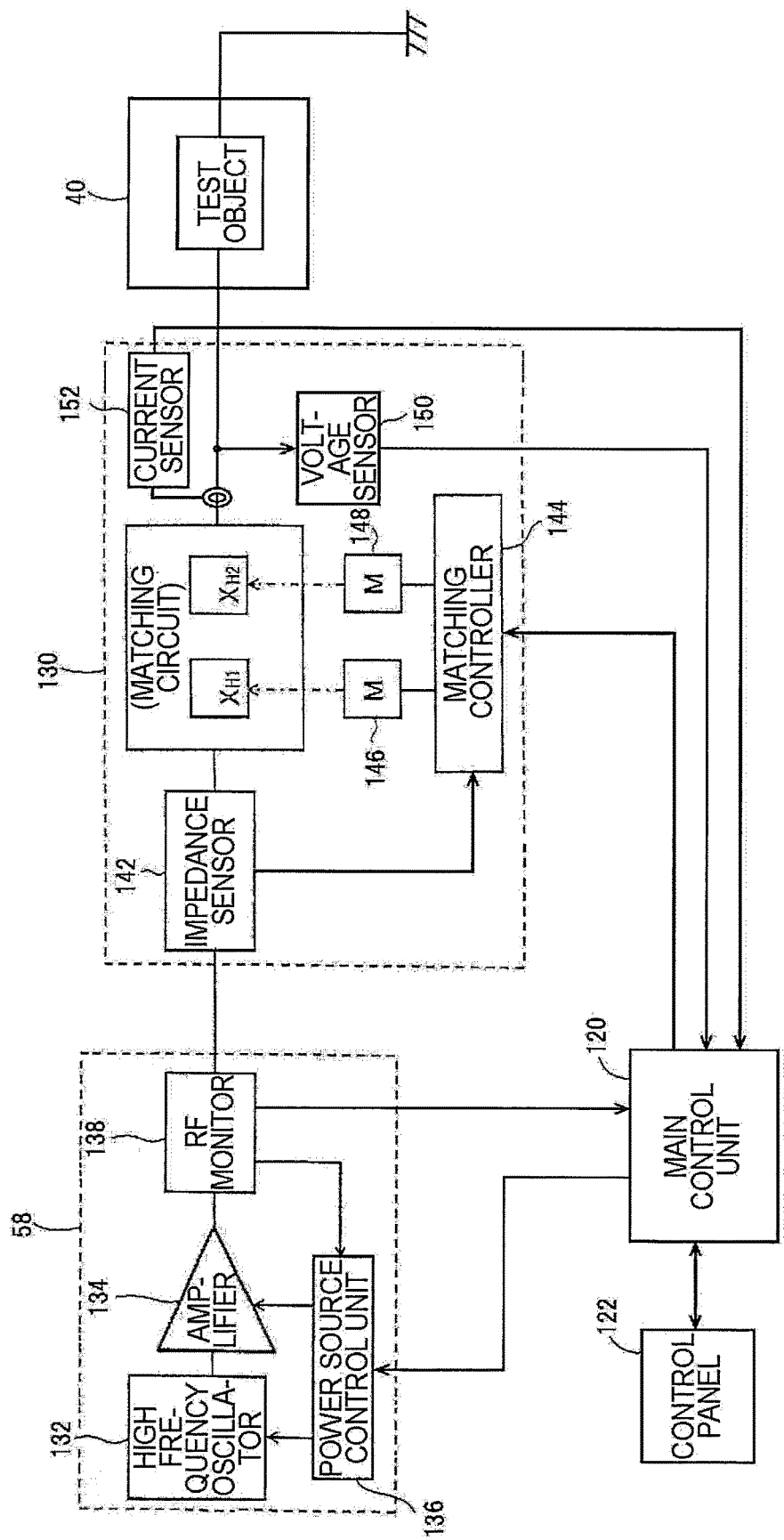
FIG. 15 is a block diagram illustrating another configuration example of a test unit in the plasma processing apparatus.

In the plasma processing apparatus of the present exemplary embodiment, as illustrated in FIGS. 14 and 15, a test unit, which is constituted by, for example, the high frequency power source 58, the first matching device 130, the main control unit 120, and the control panel 122, may perform a high frequency voltage dependency test of an impedance of a high frequency wave propagation path within the chamber 40 which includes one or more capacitive or inductive members, by taking the high frequency wave propagation path as a test object. In this case, the high frequency waves supplied from the high frequency power source 58 into the chamber 40 are used only for the test but not used for plasma generation or ion attraction. Accordingly, the processing gas is not introduced into the chamber 40 from the processing gas supply unit 104. Since the inside of the chamber 40 may not be placed in a decompressed state, the exhaust device 54 may be stopped.

In this manner, the test unit embedded in the plasma processing apparatus may not only perform the high frequency withstand voltage test as described above, but also test multilaterally and periodically a change of the high frequency voltage dependency of the impedance in the high frequency wave propagation path with elapse of time.

For example, a high frequency wave propagation path which may be selected as a test object is as follows: the first matching device 130→the power feeding rod 64→the susceptor 42→the insulative cylindrical supporting unit 44→the conductive cylindrical supporting unit 46→the chamber 40 (a ground potential member). In this case, the insulative cylindrical supporting unit 44 constitutes a capacitive member.

Alternatively, another high frequency wave propagation path which may be selected as a test object when using a short-circuit conductor (not illustrated) is as follows: the first matching device 130→the power feeding rod 64→the susceptor 42→the electrostatic chuck 68→the short-circuit conductor→the chamber 40 (ground potential member). In this case, the dielectric layer of the electrostatic chuck 68 constitutes a capacitive member. Alternatively, another high frequency wave propagation path which may be selected as a test object is as follows: the first matching device 130→the power feeding rod 64→the susceptor 42→the electrostatic chuck 68→the short-circuit conductor→the electrode plate 96→the electrode support 98→the ground potential member. In this case, the dielectric layer of the electrostatic chuck 68 constitutes a capacitive member. When the electrode plate 96 is a dielectric material, for example, quartz, the electrode plate 96 also constitutes a capacitive member.

Further, another high frequency wave propagation path which may be selected as a test object is as follows: the first matching device 130→the power feeding rod 64→the susceptor 42→the heating wires 70(IN) and 70(OUT)→the filter units 84(IN) and 84(OUT)→the ground potential member. In this case, the coils (e.g., toroidal coils) within the filter units 84(IN) and 84(OUT) constitute inductive members (parts).

The test unit of FIG. 14 corresponds to the test apparatus (FIG. 1) in the first exemplary embodiment. That is, the high frequency power source 58, the first matching device 130, the main control unit 120, the control panel 122, and a reference waveform generator 124 correspond to the high frequency power source unit 10, the matching device 14, the main control unit 20, the control panel 18, and the reference waveform generator 12 in the test apparatus (FIG. 1), respectively.

In particular, a high frequency oscillator 132, a high frequency power amplifier 134, a power source control unit 136, and an RF monitor 138 in the high frequency power source 58 correspond to the high frequency oscillator 22, the high frequency power amplifier 24, the power source control unit 26 and the directional coupler 28 in the high frequency power source unit 10, respectively. It is desirable that the RF monitor 138 has a function to measure a power of a reflected wave coming back to the high frequency power source 58 from the load side so as to display the measured power on a monitor.

In the matching device 130, a voltage sensor 140 may be a $V_{pp}$ sensor configured to detect a high frequency voltage, for example, a peak to peak value ($V_{pp}$), output from the matching device 130 and to transmit a $V_{pp}$ detection signal to the main control unit 120, and corresponds to the oscilloscope 16 (having a function to obtain and transmit observed waveform data). Variable reactance elements $X_{H1}$ and $X_{H2}$ included in a matching circuit of the matching device 130 are, for example, variable condensers or variable reactors, and the electrostatic capacitance or inductance of each of the variable reactance elements $X_{H1}$ and $X_{H2}$ is variably controlled by an automatic matching mechanism constituted by an impedance sensor 142, a matching controller 144, and motors 146 and 148.

A test unit of FIG. 15 corresponds to the test apparatus in the second exemplary embodiment (FIG. 10) except that the reference waveform generator 12 is omitted. Accordingly, a voltage sensor 150 and a current sensor 152 correspond to the voltage sensor 32 and the current sensor 34, respectively, in the test apparatus (FIG. 2).

In the test unit (FIG. 14, and FIG. 15), instead of the first high frequency power source 58 for plasma generation and the first matching device 130, the second high frequency power source 60 for ion attraction and the second matching device may be used.

Other Exemplary Embodiment or Modified Example

The capacitive coupling plasma processing apparatus in the above described exemplary embodiment is a lower-side two-frequency application type apparatus configured to apply a high frequency wave HF for plasma generation and a high frequency wave LF for ion attraction to the lower electrode (susceptor) 42 to be superimposed on each other. However, the present disclosure may also be employed in other plasma processing apparatuses configured to apply the high frequency wave HF for plasma generation to the upper electrode 94, and the high frequency wave LF for ion attraction to the lower electrode 42, or configured to apply a high frequency wave of one kind to the lower electrode 42.

The present disclosure is not limited to the capacitive coupling plasma etching apparatus, but may be employed in, for example, a microwave plasma etching apparatus, an inductive coupling plasma etching apparatus, or a helicon wave plasma etching apparatus, and further may be employed in other plasma processing apparatuses for, for example, plasma CVD, plasma oxidation, plasma nitriding, and sputtering.

Figure 16A:
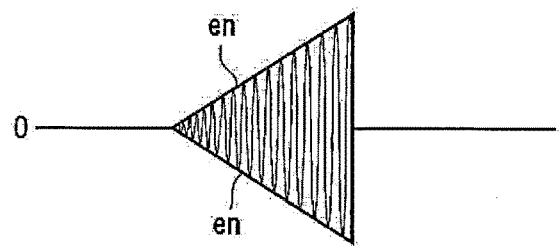
FIG. 16A is a view schematically illustrating a high frequency pulse waveform for a test in a modified example.
Figure 16B:
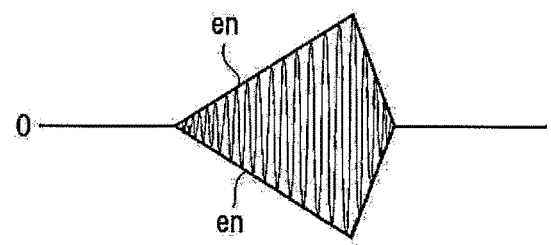
FIG. 16B is a view schematically illustrating a high frequency pulse waveform for a test in another modified example.
Figure 16C:
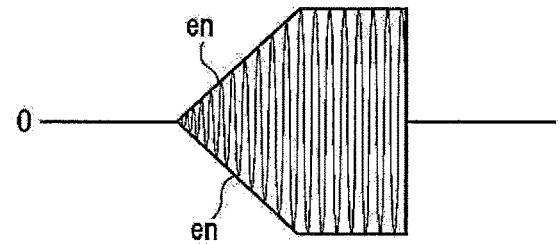
FIG. 16C is a view schematically illustrating a high frequency pulse waveform for a test in a further modified example.
Figure 16D:
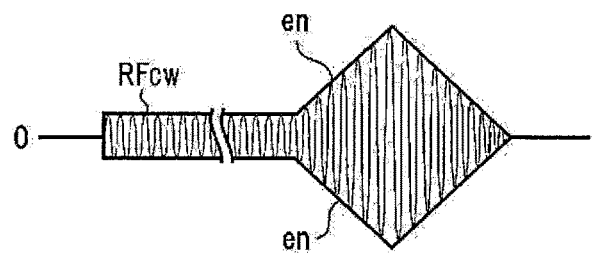
FIG. 16D is a view schematically illustrating a high frequency pulse waveform for a test in a still further modified example.

The envelope waveform of the high frequency pulse for the test is not limited to the rhomboid waveform in the above described exemplary embodiment, but may be, for example, a triangular waveform as illustrated in FIG. 16A, an intermediate waveform between triangle and rhomboid waveforms as illustrated in FIG. 16B, or a pentagonal waveform as illustrated in FIG. 16C. That is, the envelope waveform has only to have an envelope portion en increasing in a reversed taper shape in a certain section on the time axis. Accordingly, for example, when the automatic matching mechanism is used, a high frequency wave CW of a low voltage $V_{CW}$ for tuning operation and a high frequency pulse $V_{RF}$ for a test may be integrally or continuously connected. The envelope portion en increasing in a reversed taper shape is most preferably straight, but may be curved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A test apparatus of testing a high frequency voltage dependency of an impedance on a test object having a capacitive or inductive impedance, the test apparatus comprising:
   a high frequency power source unit configured to output a high frequency wave having a predetermined frequency in a variable envelope;
   a control unit configured to control the high frequency power source unit so as to output a high frequency pulse having an envelope portion increasing in a reversed taper shape in a predetermined section on a time axis;
   a matching unit configured to establish an impedance matching between the high frequency power source unit and the test object; and
   a monitor unit configured to monitor an envelope waveform of a high frequency voltage output from the matching unit and applied to the test object for a pulse duration of the high frequency pulse according to the high frequency pulse output from the high frequency power source unit; and
   wherein the monitor unit is further configured to determine whether the test object withstands the high frequency voltage applied thereto without causing an insulation failure or a dielectric breakdown in response to a determination that the envelope waveform of the high frequency voltage applied to the test object is maintained in a same envelope waveform as the high frequency pulse output from the high frequency power source unit and has a rhomboid waveform on the time axis.

2. The test apparatus of claim 1, wherein the monitor unit includes an oscilloscope.

3. The test apparatus of claim 1, wherein the monitor unit includes:
   a voltage sensor configured to detect an envelope of the high frequency voltage applied to the test object so as to generate an envelope detection signal representing the envelope of the high frequency voltage, and
   a display unit configured to display the envelope waveform of the high frequency voltage based on the envelope detection signal.

4. The test apparatus of claim 1, wherein the monitor unit includes:
   a voltage sensor configured to detect an envelope of the high frequency voltage applied to the test object so as to generate an envelope detection signal representing the envelope of the high frequency voltage, and
   a signal processing unit configured to perform a signal processing to determine whether a slope of the envelope of the high frequency voltage is bent when the envelope increases in the reversed taper shape in the predetermined section on the time axis, based on the envelope detection signal.

5. The test apparatus of claim 4, wherein when it is determined that the slope of the envelope of the high frequency voltage is bent, the signal processing unit determines a voltage value of the bent point as a high frequency withstand voltage of the test object.

6. The test apparatus of claim 1, wherein the control unit includes a reference waveform generator configured to generate a reference waveform signal that defines an envelope waveform of the high frequency pulse, and
   the high frequency power source unit includes a high frequency oscillator configured to oscillate and output the high frequency wave at a predetermined power, a high frequency power amplifier configured to amplify the high frequency wave output from the high frequency oscillator to a desired power, and a power source control unit configured to variably control a gain of the high frequency power amplifier according to the reference waveform signal generated from the reference waveform generator.

7. The test apparatus of claim 6, wherein the high frequency power source unit includes a directional coupler that is provided on a high frequency transmission line between the high frequency power amplifier and the matching unit to output a progressive wave detection signal representing a voltage of a progressive wave propagating on the high frequency transmission line in a forward direction, and the power source control unit compares the progressive wave detection signal output from the directional coupler to the reference waveform signal and variably controls the gain of the high frequency power amplifier such that a comparison error is close to zero.

8. The test apparatus of claim 6, wherein the high frequency power source unit includes a directional coupler that is provided on a high frequency transmission line between the high frequency power amplifier and the matching unit to output a reflected wave detection signal representing a voltage or a power of a reflected wave propagating on the high frequency transmission line in a reverse direction, and the power source control unit stops amplification of the high frequency power amplifier immediately when the voltage or the power of the reflected wave exceeds a predetermined threshold value based on the reflected wave detection signal output from the directional coupler.

9. The test apparatus of claim 1, wherein the high frequency pulse output from the high frequency power source unit has a triangular envelope waveform.

10. The test apparatus of claim 1, wherein the high frequency pulse output from the high frequency power source unit has a rhomboid envelope waveform.

11. A test apparatus of testing a high frequency voltage dependency of an impedance on a test object having a capacitive or inductive impedance, the test apparatus comprising:

a high frequency power source unit configured to output a high frequency wave having a predetermined frequency;

a matching unit configured to establish impedance matching between the high frequency power source unit and the test object;

a control unit configured to control the high frequency power source unit so as to intermittently output a plurality of high frequency pulses each having an amplitude increasing with elapse of time on a time axis;

a voltage measuring unit configured to measure a high frequency voltage output from the matching unit and applied to the test object according to each of the plurality of high frequency pulses;

a current measuring unit configured to measure a high frequency current output from the matching unit and flowing in the test object according to each of the plurality of high frequency pulses;

an impedance calculating unit configured to calculate an impedance measurement value of the test object based on a voltage measurement value and a current measurement value which are obtained from the voltage measuring unit and the current measuring unit, respectively; and a monitoring unit configured to determine whether an impedance of the test object at a present time has substantially the same value as an impedance of the test object at the high frequency pulse applied at a previous time such that the monitoring unit determines the high frequency voltage dependency of the impedance based on the voltage measurement value obtained from the voltage measuring unit and the impedance measurement value obtained from the impedance calculating unit, and wherein the high frequency voltage is applied to the test object for a pulse duration of the high frequency pulse.

12. The test apparatus of claim 11, wherein, when the impedance measurement value at an $n^{th}$ (n is an integer of 2 or more) high frequency pulse is smaller than the impedance measurement value at an $(n-1)^{th}$ high frequency pulse by a predetermined value or more, the monitoring unit determines a high frequency withstand voltage of the test object based on at least one of the voltage measurement value at the $(n-1)^{th}$ high frequency pulse and the voltage measurement value at the $n^{th}$ high frequency pulse.

13. The test apparatus of claim 11, wherein, when the impedance measurement value at an $n^{th}$ (n is an integer of 2 or more) high frequency pulse is not smaller than the impedance measurement value at an $(n-1)^{th}$ high frequency pulse by a predetermined value or more and the voltage measurement value at the $n^{th}$ high frequency pulse is larger than a predetermined upper limit voltage value, the monitoring unit determines that the test object is capable of withstanding the upper limit voltage value.

14. The test apparatus of claim 1, wherein the test object is provided at one path in which a high frequency wave flows in a plasma processing apparatus, and a test is performed on the test object without generating plasma within a chamber of the plasma processing apparatus.

15. A plasma processing apparatus comprising:

a processing container configured to perform a plasma processing;

a high frequency electrode provided within the processing container to be applied with a high frequency wave during the plasma processing;

at least one member having a capacitive or inductive impedance and formed on a predetermined high frequency wave propagation path that extends from a high frequency power source unit to a ground potential member via the high frequency electrode; and the test apparatus of claim 1 which tests a high frequency voltage dependency of the impedance on the high frequency wave propagation path.

16. The test apparatus of claim 1, wherein the control unit is further configured to control the matching unit so as to pass the high frequency pulse output from the high frequency power source unit so that the high frequency pulse is boosted to a voltage required for a high frequency withstand voltage test to be applied to the test object.

17. The test apparatus of claim 1, wherein when the test object is an inductive member, a matching circuit of the matching unit is configured as a T-type coupling circuit.

18. The test apparatus of claim 17, wherein the inductive member includes a core containing coil.

19. The test apparatus of claim 11, wherein the control unit is further configured to control the matching unit so as to pass the high frequency pulse output from the high frequency power source unit so that the high frequency pulse is boosted to a voltage required for a high frequency withstand voltage test to be applied to the test object.

* * * * *